US008367235B2

(12) United States Patent
Huang

(10) Patent No.: US 8,367,235 B2
(45) Date of Patent: *Feb. 5, 2013

(54) BATTERY PACK, HOLSTER, AND EXTENDIBLE PROCESSING AND INTERFACE PLATFORM FOR MOBILE DEVICES

(75) Inventor: Daniel Huang, Santa Ana, CA (US)

(73) Assignee: mophie, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/357,262

(22) Filed: Jan. 21, 2009

(65) Prior Publication Data

US 2009/0186264 A1    Jul. 23, 2009

Related U.S. Application Data

(63) Continuation of application No. 12/357,262, filed on Jan. 21, 2009, which is a continuation-in-part of application No. 12/356,068, filed on Jan. 19, 2009, now abandoned.

(60) Provisional application No. 61/021,897, filed on Jan. 18, 2008.

(51) Int. Cl.
*H01M 2/10* (2006.01)
*H01M 6/04* (2006.01)
*G02B 5/14* (2006.01)

(52) U.S. Cl. ...... 429/96; 429/100; 429/188; 361/679.56

(58) Field of Classification Search ............ 429/96, 429/97, 98, 100, 188; 361/679.56
See application file for complete search history.

(56) References Cited

U.S. PATENT DOCUMENTS

| | | | | |
|---|---|---|---|---|
| 5,001,772 A | * | 3/1991 | Holcomb et al. ........... | 455/575.1 |
| 5,368,159 A | | 11/1994 | Doria | |
| 5,508,123 A | * | 4/1996 | Fan ................................ | 429/96 |
| D372,896 S | | 8/1996 | Nagele et al. | |
| 5,586,002 A | | 12/1996 | Notarianni | |
| 5,604,050 A | | 2/1997 | Brunette et al. | |
| 5,610,979 A | | 3/1997 | Yu | |
| 5,708,707 A | | 1/1998 | Halttlunen et al. | |
| 5,711,013 A | | 1/1998 | Collett et al. | |
| D392,248 S | | 3/1998 | Johansson | |
| D392,939 S | | 3/1998 | Finke-Anlauff | |
| 5,786,106 A | * | 7/1998 | Armani .......................... | 429/98 |
| D400,495 S | | 11/1998 | Deslyper et al. | |
| 5,864,766 A | | 1/1999 | Chiang | |
| 5,973,477 A | * | 10/1999 | Chang .......................... | 320/114 |

(Continued)

OTHER PUBLICATIONS

Notification of Transmittal of the International Search Report and the Written Opinion of the International Searching Authority, or the Declaration dated Jul. 13, 2011 for PCT/US2011/037249 based on U.S. Appl. No. 61/346,386.

(Continued)

*Primary Examiner* — Patrick Joseph Ryan
*Assistant Examiner* — Julian Anthony
(74) *Attorney, Agent, or Firm* — Matthew D. Bottomly

(57) ABSTRACT

A battery pack is provided for a mobile communication device, comprising a casing defining a cavity that conforms, at least partially, to the outer shape of the mobile communication device and one or more rechargeable power cells housed within the thickness of the casing. An internal interface engages a corresponding interface on the mobile communication device to provide power from the one or more rechargeable cells to the mobile communication device. An external interface is electrically coupled to the internal interface in order to transmit signals from the mobile communication device to an external device and may further serve to recharge the one or more rechargeable power cells. The battery pack may also serve as an extendible platform by providing additional integrated communication interfaces and/or processors that can be utilized by the mobile communication device to extend its communication and/or processing capabilities.

54 Claims, 21 Drawing Sheets

U.S. PATENT DOCUMENTS

| | | | |
|---|---|---|---|
| 6,043,626 A | 3/2000 | Snyder et al. | |
| 6,171,138 B1 | 1/2001 | Lefebvre et al. | |
| 6,184,654 B1 | 2/2001 | Bachner, III et al. | |
| 6,208,115 B1 * | 3/2001 | Binder | 320/108 |
| 6,317,313 B1 | 11/2001 | Mosgrove et al. | |
| 6,324,380 B1 | 11/2001 | Kiuchi et al. | |
| D460,411 S | 7/2002 | Wang | |
| 6,538,413 B1 | 3/2003 | Beard et al. | |
| 6,555,990 B1 | 4/2003 | Yang | |
| 6,614,722 B2 | 9/2003 | Polany et al. | |
| 6,992,461 B2 | 1/2006 | Liang et al. | |
| 7,166,987 B2 | 1/2007 | Lee et al. | |
| D547,056 S | 7/2007 | Griffin et al. | |
| D547,057 S | 7/2007 | Griffin et al. | |
| D556,681 S | 12/2007 | Kim | |
| D558,972 S | 1/2008 | Oh | |
| D558,973 S | 1/2008 | Hussaini et al. | |
| D561,092 S | 2/2008 | Kim | |
| 7,336,973 B2 | 2/2008 | Goldthwaite | |
| 7,400,917 B2 | 7/2008 | Wood et al. | |
| D575,056 S | 8/2008 | Tan | |
| 7,428,427 B2 | 9/2008 | Brunstrom et al. | |
| D581,151 S | 11/2008 | Aipa | |
| D582,149 S | 12/2008 | Tan | |
| 7,479,759 B2 | 1/2009 | Vilanov et al. | |
| D587,896 S | 3/2009 | Aipa | |
| D601,955 S | 10/2009 | Ekme | |
| D601,959 S | 10/2009 | Lee et al. | |
| 7,612,997 B1 * | 11/2009 | Diebel et al. | 361/679.56 |
| D610,538 S | 2/2010 | Wu et al. | |
| 7,782,610 B2 | 8/2010 | Diebel et al. | |
| D632,648 S | 2/2011 | Yang | |
| D634,704 S | 3/2011 | Tieleman et al. | |
| D637,952 S | 5/2011 | Tan | |
| D639,731 S | 6/2011 | Sun | |
| 2001/0054148 A1 | 12/2001 | Hoornaert | |
| 2002/0147035 A1 | 10/2002 | Su | |
| 2003/0096642 A1 | 5/2003 | Bessa et al. | |
| 2003/0218445 A1 | 11/2003 | Behar | |
| 2003/0228866 A1 | 12/2003 | Pezeshki | |
| 2004/0097256 A1 | 5/2004 | Kujawski | |
| 2004/0104268 A1 | 6/2004 | Bailey | |
| 2005/0090301 A1 | 4/2005 | Lange et al. | |
| 2005/0231159 A1 | 10/2005 | Jones et al. | |
| 2005/0247787 A1 | 11/2005 | Von Mueller et al. | |
| 2005/0248312 A1 | 11/2005 | Cao et al. | |
| 2006/0058073 A1 | 3/2006 | Kim | |
| 2006/0063569 A1 | 3/2006 | Jacobs et al. | |
| 2006/0099999 A1 | 5/2006 | Park | |
| 2007/0152633 A1 | 7/2007 | Lee | |
| 2007/0167190 A1 | 7/2007 | Moosavi et al. | |
| 2007/0236180 A1 | 10/2007 | Rodgers | |
| 2007/0297149 A1 | 12/2007 | Richardson et al. | |
| 2008/0007214 A1 | 1/2008 | Cheng | |
| 2008/0053770 A1 | 3/2008 | Tynyk | |
| 2008/0096620 A1 | 4/2008 | Lee et al. | |
| 2008/0108395 A1 | 5/2008 | Lee et al. | |
| 2008/0123287 A1 | 5/2008 | Rossell et al. | |
| 2008/0132289 A1 | 6/2008 | Wood et al. | |
| 2009/0051319 A1 | 2/2009 | Fang et al. | |
| 2009/0069050 A1 | 3/2009 | Jain | |
| 2009/0073650 A1 | 3/2009 | Huang | |
| 2009/0143104 A1 | 6/2009 | Loh | |
| 2009/0144456 A1 | 6/2009 | Gelf | |
| 2009/0186264 A1 | 7/2009 | Huang | |
| 2010/0026589 A1 | 2/2010 | Dou | |
| 2010/0064883 A1 | 3/2010 | Gynes | |

OTHER PUBLICATIONS

Notification of Transmittal of the International Search Report and the Written Opinion of the International Searching Authority, or the Declaration dated Jul. 13, 2011 for PCT/US2011/037254 based on U.S. Appl. No. 61/346,386.

Notification of Transmittal of the International Search Report and the Written Opinion of the International Searching Authority, or the Declaration dated Jul. 19, 2011 for PCT/US2011/037244 based on U.S. Appl. No. 61/346,386.

Notification of Transmittal of the International Search Report and the Written Opinion of the International Searching Authority, or the Declaration dated Sep. 22, 2011 for PCT/US2011/037257 based on U.S. Appl. No. 61/346,386.

Mophie Juice Pack iPhone 1G Product Reference, May 1, 2008, 22 pages.

Horwitz, Jeremy; "Kensington Mini Battery Pack and Charger for iPhone and iPod," iLounge; May 16, 2008; available at http://www.ilounge.com/index.php/reviews/entry/kensington-mini-battery-pack-and-charger-for-iphone-and-ipod/; retrieved May 12, 2009; 3 pages.

Rafferty, Sven; Mybat External Battery for iPhone and iPod; SvenOnTech; May 18, 2008; available at <http://sventech,com/reviews/?p=74>; retrieved May 12, 2009; 4 pages.

Rees, Dave; "Richard Solo Backup Battery for iPhone/iPod Review," The Gadgeteer Jun. 16, 2008; available at http://the-gadgeteer.com/2008/06/16/richard_solo_backup_battery_for_iphone_ipod/; retrieved May 12, 2009; 8 pages.

Coldewey, Devin; "Combination iPhone battery pack and flash from FastMac," CrunchGear; Nov. 4, 2008; available at http://www.crunchgear.com/2008/11/04/ combination-iphone-battery-pack-and-flash-from-fastmac/>; retrieved May 12, 2009; 3 pages.

"Cheap DIY iPhone External Battery"; Michael Fisher's Web Log; Jul. 22, 2008; available at http://fastdad.wordpress.com/2008/07/22/cheap-diy-iphone-external-battery/>; retrieved May 12, 2009 10 pages.

Mophie Juice Pack iPhone 3G Product Reference, Aug. 4, 2008, 33 pages.

"Mini Battery Pack and Charger for iPhone and iPod," Kensington; Sep. 30, 2008; available at http://files.acco.com/KENSINGTON/K33442US/K33442US-usconsumer.pdf; retrieved May 12, 2009, 1 page.

Horwitz, Jeremy ; "iLuv i603/ i604 Rechargeable Lithium Polymer Batteries with Silicone Skin," iLounge; Jun. 27, 2006 available at http://www.ilounge.com/index.php/reviews/iluv-i603-rechargeable-lithium-polymer-battery-with-silicone-skin/>; retrieved May 12, 2009; 3 pages.

* cited by examiner

BATTERY PACK, HOLSTER, AND EXTENDIBLE PROCESSING AND INTERFACE PLATFORM FOR MOBILE DEVICES

CROSS REFERENCE TO RELATED APPLICATIONS

This application is a continuation application of U.S. application Ser. No. 12/357,262, filed Jan. 21, 2009, which is a continuation-in-part application of U.S. application Ser. No. 12/356,068, filed Jan. 19, 2009, now abandoned, and claims priority to U.S. provisional application Ser. No. 61/021,897, entitled "Battery Pack and Holster for Mobile Devices" filed Jan. 18, 2008, the disclosures of which are hereby expressly incorporated by reference.

FIELD

One embodiment relates to battery packs and/or holsters and, more particular, to an external battery pack and/or holster for mobile electronic devices.

BACKGROUND

Many mobile devices (e.g., mobile phones, digital assistants, mobile communication devices, handheld computing devices, personal music/video/content players and storage devices) are often powered by battery power sources. Such battery power sources are often housed within the mobile device and may be changed and/or recharged as needed. However, as more powerful mobile devices are designed, these tend to consume power more quickly, thereby shortening the time between charges. This tends to limit the usefulness of the mobile device since the user must find a power source to recharge the battery source and wait until it is recharged.

Additionally, after a certain number of recharges, a battery source may need to be replaced as it may no longer hold a charge. Oftentimes, it is not easy to replace a battery source as the mobile device may need to be disassembled or opened to reach the battery source.

Therefore, a way is needed to extend the time between charges of mobile devices and/or continue to power the mobile device even after an internal power source has been depleted.

SUMMARY

According to one embodiment, a battery pack for a mobile communication device is provided comprising a casing and one or more rechargeable power cells. The casing may define a cavity that conforms, at least partially, to the outer shape of the mobile communication device. Additionally, the casing may further define one or more access openings to permit access to integrated interfaces (e.g., power button, camera lens, audio jack, etc.) of the mobile communication device.

The one or more rechargeable power cells may be housed within the thickness of the casing. For example, the power cells may be housed within the thickness of a back plane of the casing. The casing may secure the mobile communication device within the cavity while at least one surface of the mobile communication device remains exposed.

The battery pack may also include an internal interface and/or external interface. The internal interface may engage a corresponding interface on the mobile communication device to provide power from the one or more rechargeable cells to the mobile communication device. The external interface may be electrically coupled to the internal interface in order to transmit signals from the mobile communication device to an external device. The external interface may further serve to recharge the one or more rechargeable power cells.

The battery pack may further comprise a recharging device integrated within the battery pack that wirelessly recharges the one or more rechargeable power cells. This may include an inductive electrical recharging system that requires no direct contact or can recharge at a distance.

According to one aspect, the battery pack may also include additional communication interfaces and/or processors. For instance, a plurality of communication interfaces may be coupled to the internal interface, wherein the mobile communication device can transmit and receive signals via the communication interfaces. Likewise, at least one processor within the battery pack may be coupled to the internal interface and adapted to collect information via one or more interfaces of the battery pack and provide the collected information to the mobile communication device. In one example, the at least one processor may be adapted to execute one or more instructions under the control of the mobile communication device.

The battery pack may also include a display interface integrated into the battery pack to display information to a user. Such display interface may allow expanding the display from the mobile communication device to the display interface.

According to one aspect, the thickness of the battery pack may be approximately or substantially the same as the thickness of the mobile communication device. For this purpose, the battery pack may be slim and/or have an ergonomic shape so that it does not significantly increase the thickness and/or size of the mobile communication device. Consequently, mobile communication device can be used within the battery pack for extended periods of time since the battery pack does not significantly increase the bulkiness of the mobile communication device.

According to one embodiment, a battery pack for a mobile device is provided, comprising: a back plane, a first and second sides, a bottom side, and one or more battery cells housed within the thickness of the back plane. The back plane and first, second and bottom sides may define a cavity for mounting the mobile device. The one or more battery cells may be rechargeable while a mobile device is mounted within the cavity. The battery pack may also include an internal interface that electrically couples the one or more battery cells to the mobile device.

Additionally, the battery pack may include one or more speakers housed within the thickness of the back plane. The speakers may be electrically coupled to an interface to allow a mobile device mounted in the cavity to send audio signals through the one or more speakers. Similarly, the battery pack may include one or more microphones housed within the thickness of the back plane and electrically coupled to an interface to allow a mobile device mounted in the cavity to receive audio signals from the one or more microphones.

According to yet another aspect, the battery pack may include a plurality of communication interfaces coupled to the internal interface, wherein the mobile communication device can transmit and receive signals via the communication interfaces. The battery pack may also include at least one processor coupled to the internal interface and adapted to collect information via one or more of the plurality of communication interfaces and provide the collected information to the mobile communication device.

The thickness of the battery pack may be less than twice the thickness of the mobile communication device.

According to yet another feature a battery pack is provided comprising: (a) a holster defining a cavity that conforms, at least partially, to the outer shape of the mobile communication device; (b) one or more rechargeable power cells; and/or (c) an electrical connector to provide power from the one or more rechargeable power cells to the mobile communication device.

DETAILED DESCRIPTION OF THE INVENTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Various embodiments provide battery packs shaped to conform to the external shape of a mobile device, thereby providing a permanent or long-term replacement power source without significantly affecting the size and usability of the mobile device.

According to one feature, the battery pack may provide recharge power to the mobile device while also providing an external signaling and/or charging interface to the mobile device. This way, the mobile device need not be removed from the battery pack in order to charge it or provide data (e.g., synchronization, etc.).

According to yet another feature, the battery pack may include one or more different types of communication interfaces to extend the communication capabilities of the mobile device. This allows the mobile device to communicate via other interfaces that may not be built into the mobile device.

According to yet another feature, the battery pack may include one or more processors to extend the processing capabilities of the battery pack. For instance, the one or more processors may increase the processing capabilities of the battery pack and/or provide purpose-specific processors. That is, the interface between the battery pack and mobile device may allow the mobile device to use the one or more processors to execute application on the battery pack. Note that such applications may, in some instances, continue to operate even if the mobile device is detached from the battery pack.

According to yet another feature, the battery pack may include and inductive recharging device or a near-distance recharging device so that its power cells may be recharged without actually physically plugging it to a recharge power source.

First Embodiment of Battery Pack

Figure 1:
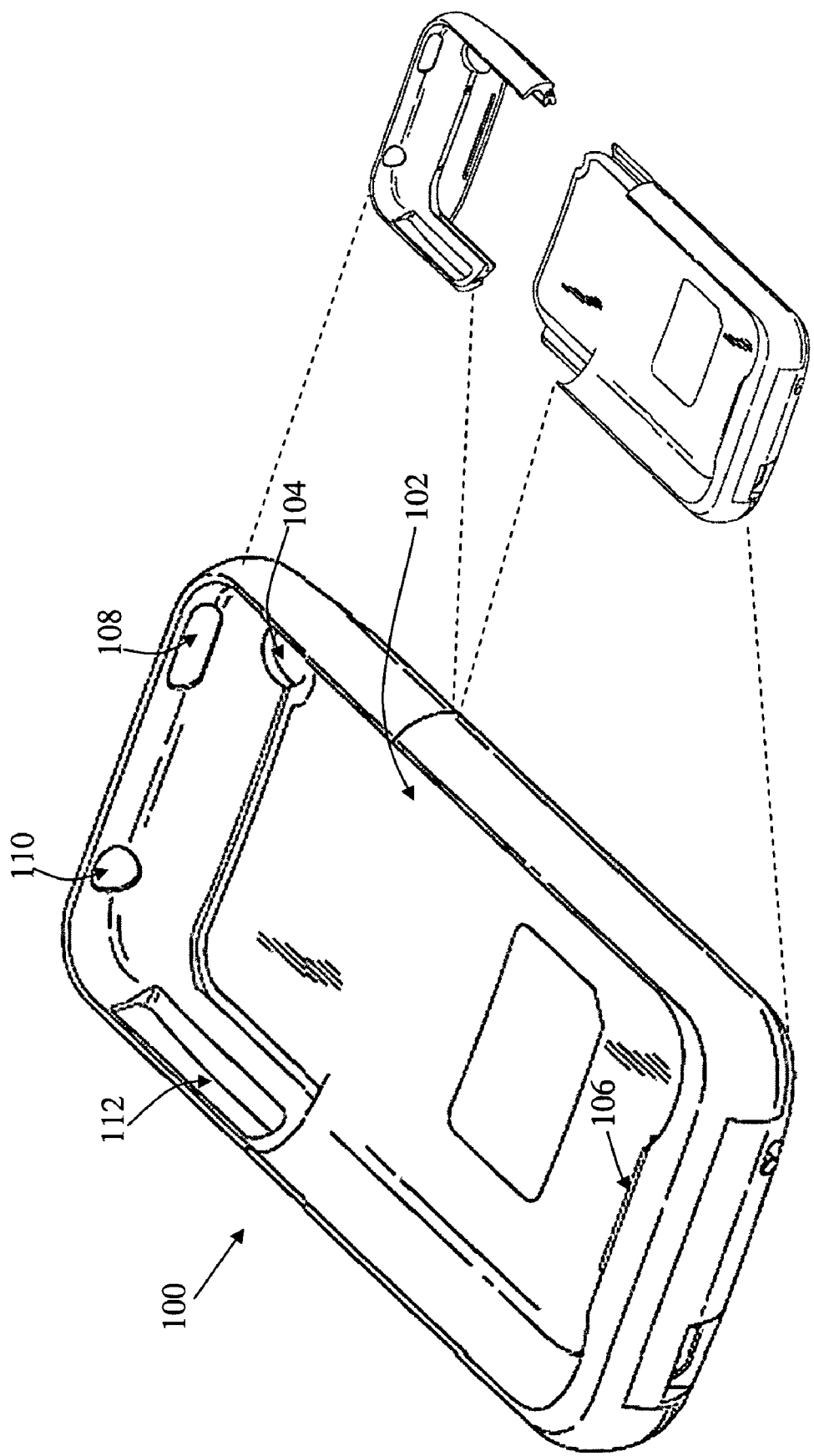
FIG. 1 illustrates a perspective view of a battery pack for a mobile device according to one example.

FIG. 1 illustrates a perspective view of a battery pack for a mobile device according to one example. In this example, the battery pack 100 is shaped to receive or house a mobile phone within a contoured cavity 102. The battery pack 100 has an integrated rechargeable power cell capable of providing power to operate and/or recharge a mobile device (e.g., iPhone™ by Apple Inc., etc.).

Figure 2:
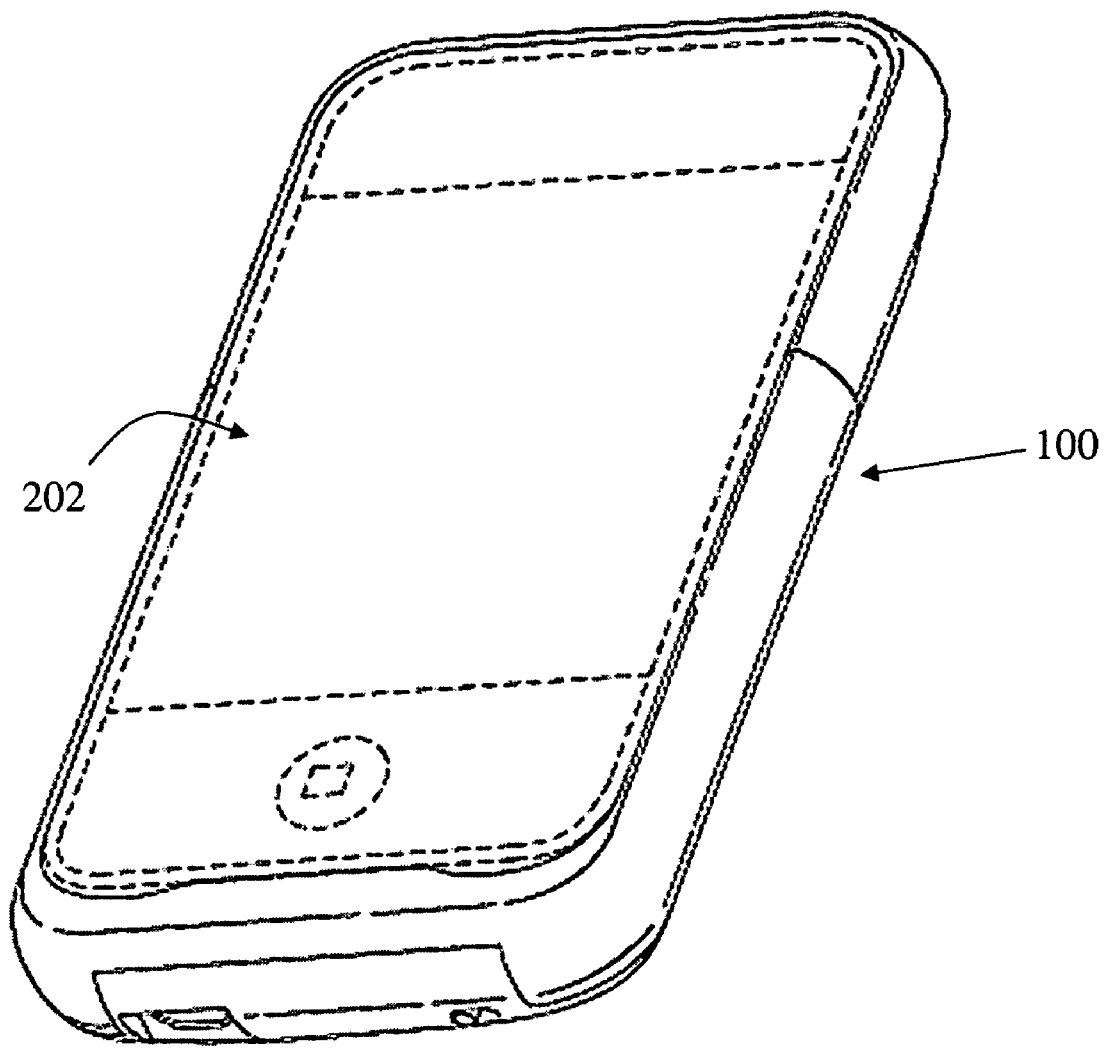
FIG. 2 illustrates how a mobile device can be housed within the battery pack of FIG. 1.

FIG. 2 illustrates how a mobile device can be housed within the battery pack 100 of FIG. 1. As can be appreciated from this figure, the battery pack 100 is shaped to closely wrap around the mobile device 202 and serves as a protective case for the mobile device 100.

Figure 3:
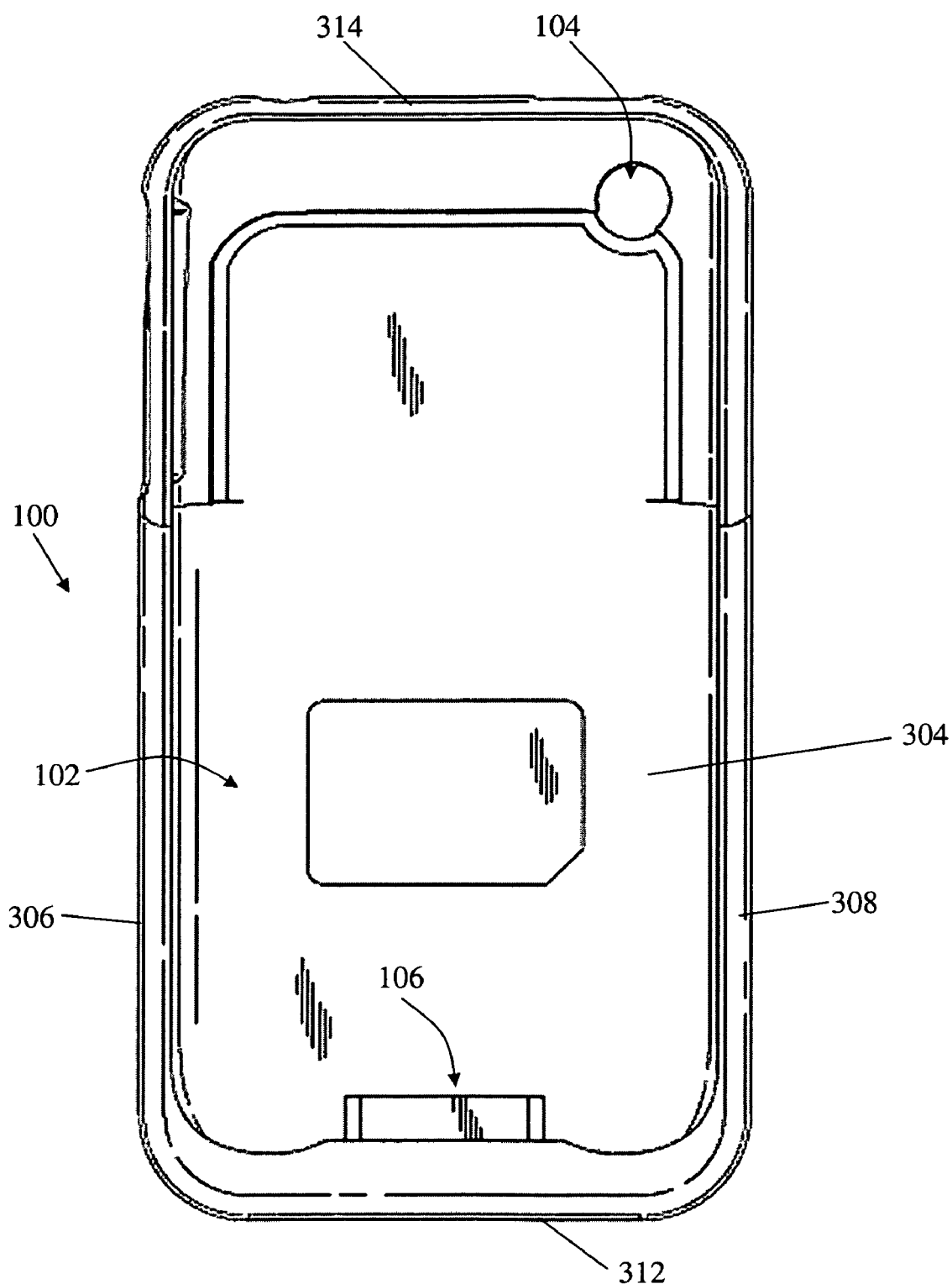
FIG. 3 illustrates a front view of the battery pack of FIG. 1.

FIG. 3 illustrates a front view of the battery pack 100 of FIG. 1. The battery pack 100 includes a back plane 304, first and second sides 306 and 308, a bottom side 312, and a top side 314. The back plane 304, first and second sides 306, bottom side 312 and top side 314 may be shaped to form a pocket or cavity 102 in which a mobile device to be powered can be housed. The top side 314 of the battery pack 100 may slide out to allow insertion and removal of the mobile device.

Referring again to FIG. 1, the battery pack 100 may include one or more openings 104, 108, 110, and 112 to facilitate access to various features of the mobile phone. For instance, a first opening 104 on the back plane 304 of the battery pack 100 may allow unobstructed view for a camera lens on the back of the mobile device. A second opening 108 may provide access to a screen on/off switch for the mobile device. A third opening 110 may provide access to an audio jack on the mobile device. A fourth opening 112 on the first side 306 may provide access to a volume control sliding switch.

The battery pack 100 may also include a connector or interface 106 within the cavity 102 (e.g., on the bottom side 312) through which power can be provided to the mobile device from the internal power cell of the battery pack 100. Additionally, the connector 106 may be coupled to an external interface to provide input and/or output signals to the mobile device.

From FIG. 1, it can be appreciated that the battery pack may include two sections that separate to allow insertion of the mobile device and can then be coupled together to secure the mobile device in place. The size and shape of the battery pack 100 may be approximately that of the external contour of a mobile device to which it is intended to provide power.

Figure 4:
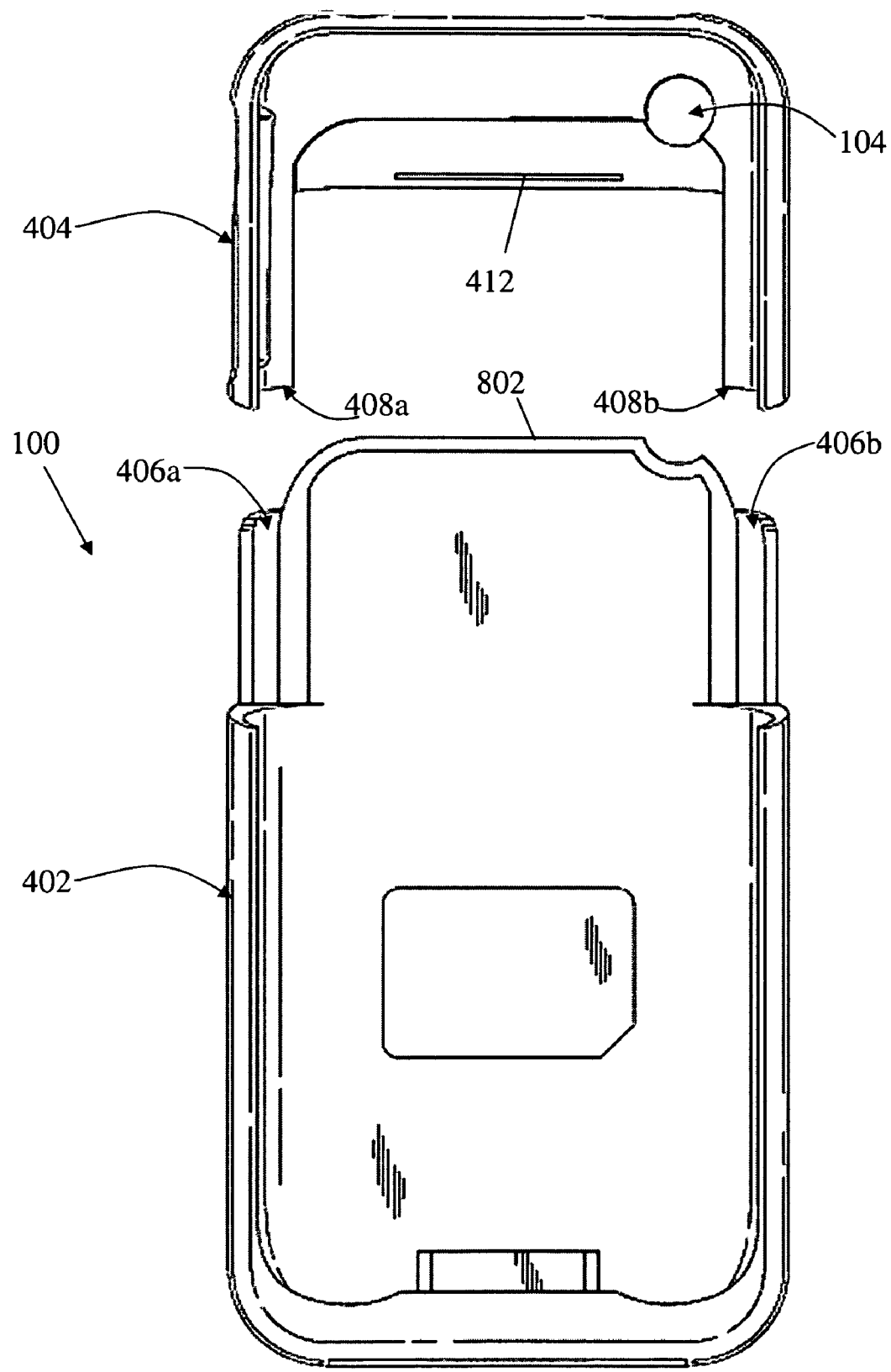
FIG. 4 illustrates the battery pack of FIG. 1 in an open configuration.

FIG. 4 illustrates the battery pack of FIG. 1 in an open configuration. The battery pack 100 may include a bottom section 402 and a top section 404 that can be separated from each other to insert a mobile device within the battery pack 100 and can them be coupled together secure the mobile device in place. For example, the bottom section 402 may include receiving grooves 406a and 406b that receive rails 408a and 408b from the top section 404. In this manner, the top section 404 can be coupled to the bottom section 402 by pressure fit. For example, a tongue section 802 (FIG. 8) may slide on to the top section 404 such that an engaging tab 412 couples into a receiving groove 804 (FIG. 8) to secure the top section 404 to the bottom section 402.

Figure 5:
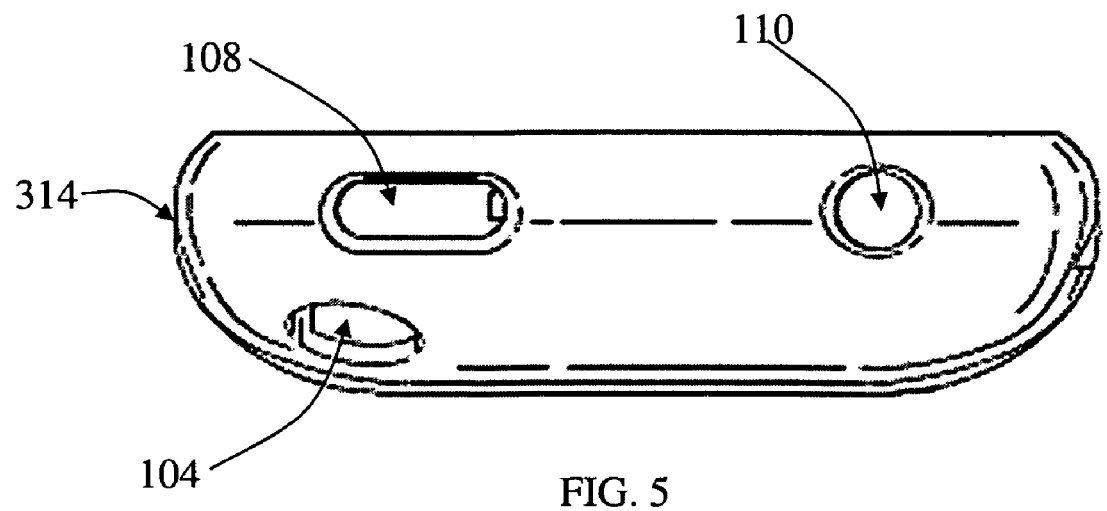
FIG. 5 illustrates a top view of the battery pack of FIG. 1.

FIG. 5 illustrates a top view of the battery pack 100 of FIG. 1. In this view, the top side 314 of the battery pack 100 is shown and the first opening 104, second opening 108, and third opening 110 can be appreciated.

Figure 6:
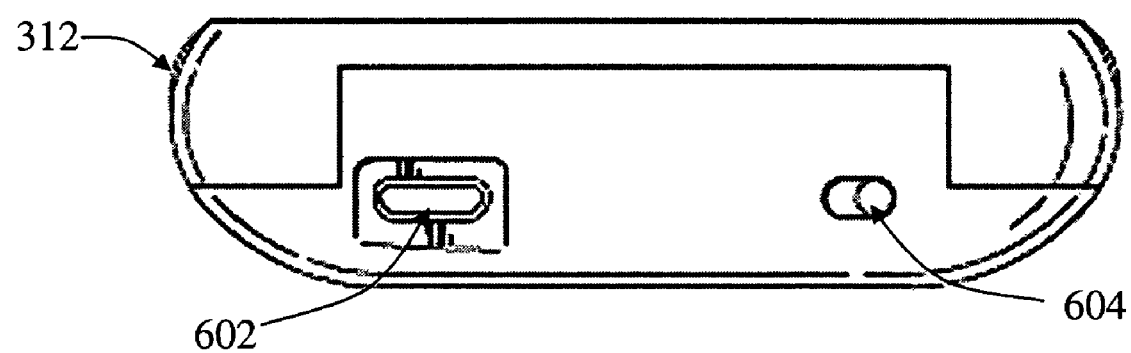
FIG. 6 illustrates a bottom view of the battery pack of FIG. 1.

FIG. 6 illustrates a bottom view of the battery pack 100 of FIG. 1. In this view, the bottom side 312 of the battery pack 100 is shown. In this view, an external interface 602 (e.g., micro USB connector) is shown. This external interface 602 may serve to recharge the internal power cell of the battery pack. Additionally, the external interface 602 may also provide a pass-through signaling interface for the internal connector or interface 106, thereby allowing the mobile device to communicate via the external interface 602. A switch 604 may also be located on the bottom side 312 of the battery pack and can function to switch power from the battery pack On or Off. That is, when the mobile device has sufficient power on its own, the power cell of the battery pack is not needed and can be switched Off until it is needed.

Figure 7:
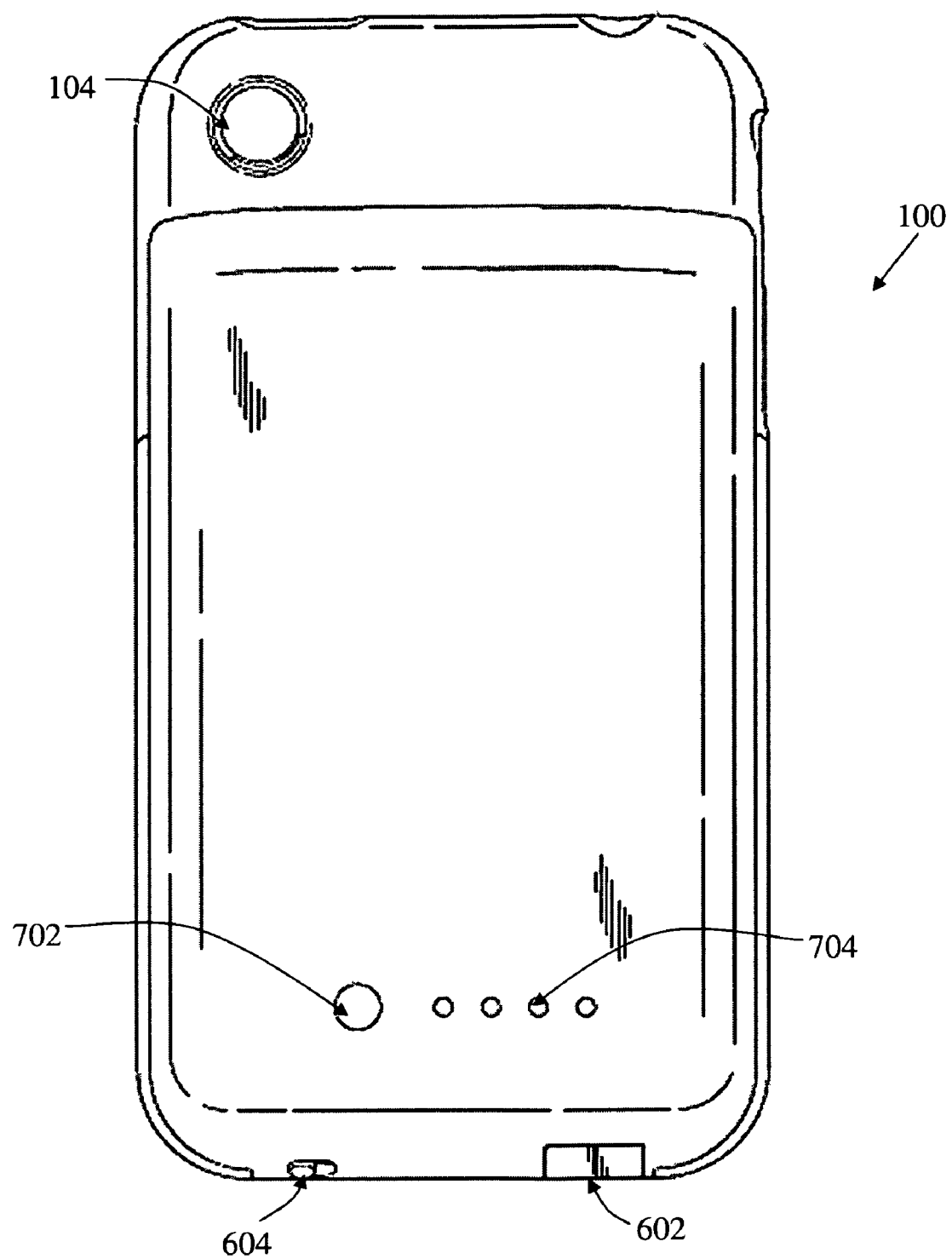
FIG. 7 illustrates a back view of the battery pack of FIG. 1.

FIG. 7 illustrates a back view of the battery pack 100 of FIG. 1. In this example, a test button 702 is provided that, when pushed, causes plurality of LED lights 704 to indicate the power or charge level of the internal power cell of the battery pack 100.

Figure 8:
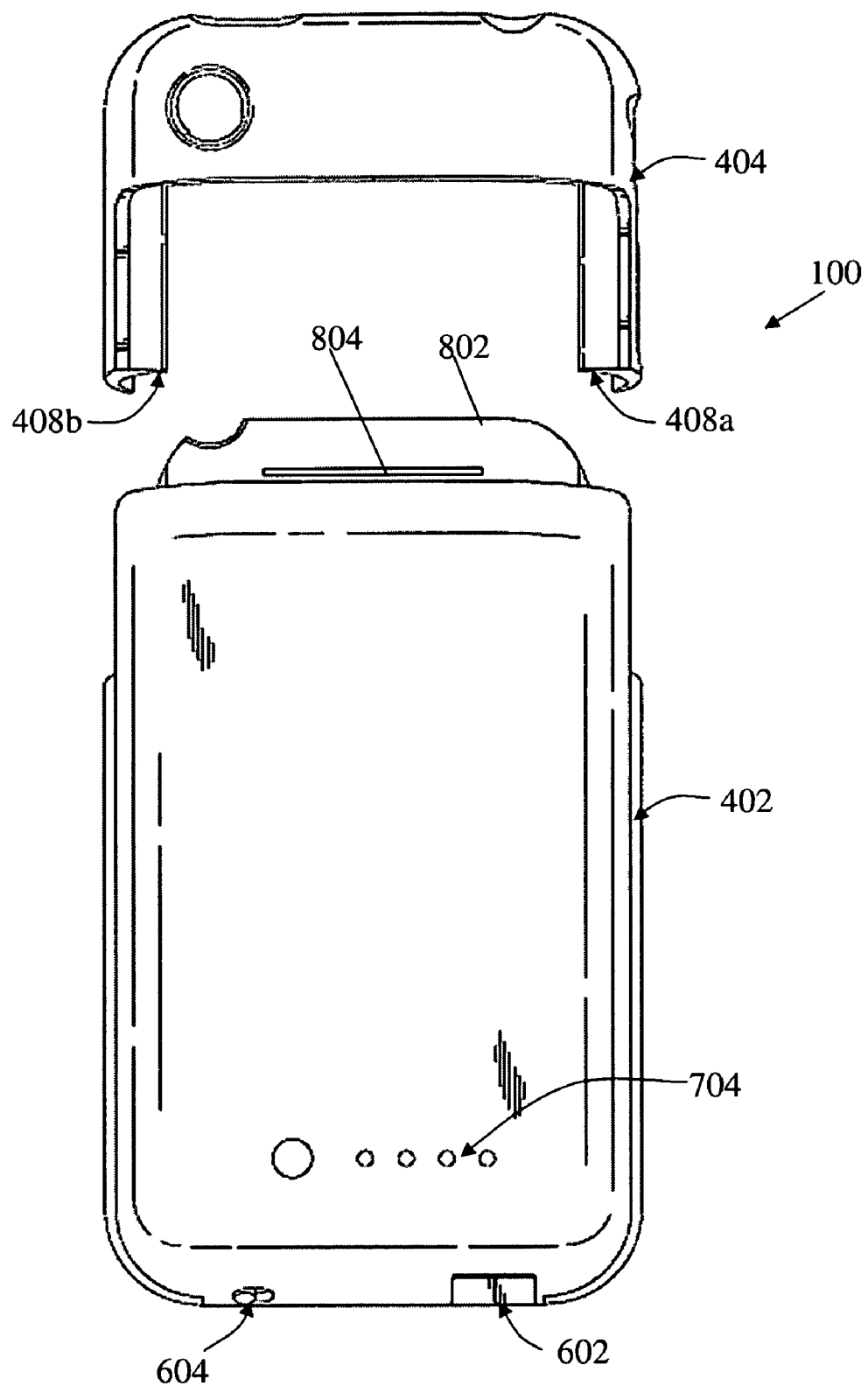
FIG. 8 illustrates back view of the battery pack of FIG. 1 in an open position.

FIG. 8 illustrates back view of the battery pack 100 of FIG. 1 in an open position.

Figure 9:
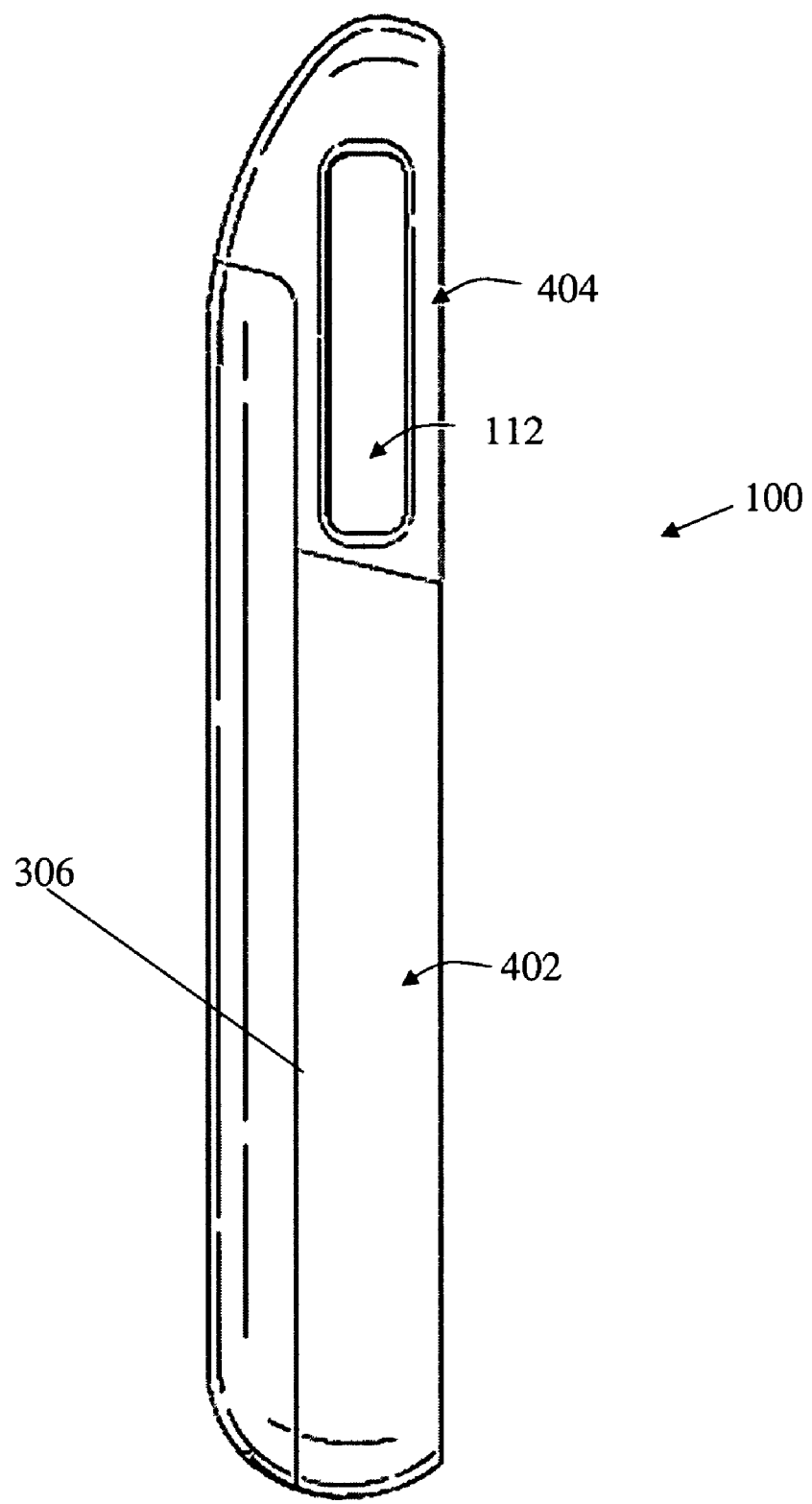
FIG. 9 illustrates a first side view of the battery pack of FIG. 1.

FIG. 9 illustrates a first side view of the battery pack of FIG. 1.

Figure 10:
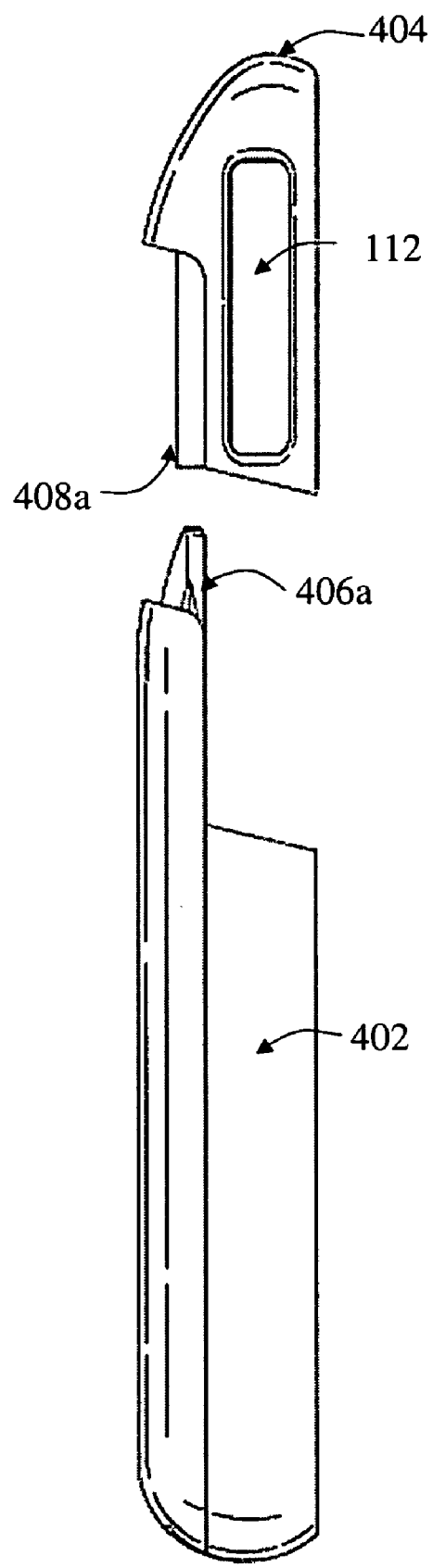
FIG. 10 illustrates the first side view of the battery pack of FIG. 1 in an open position.

FIG. 10 illustrates the first side view of the battery pack of FIG. 1 in an open position.

Figure 11:
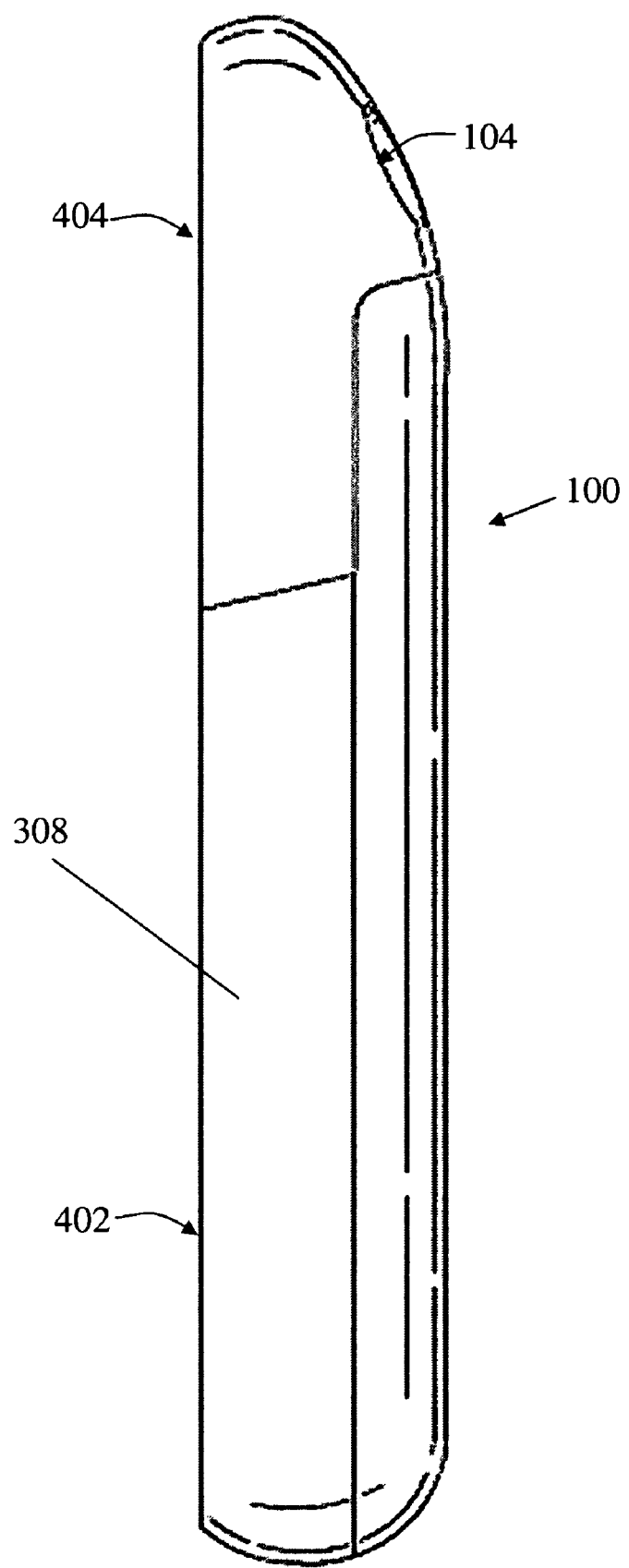
FIG. 11 illustrates a second side view of the battery pack of FIG. 1.

FIG. 11 illustrates a second side view of the battery pack of FIG. 1.

Figure 12:
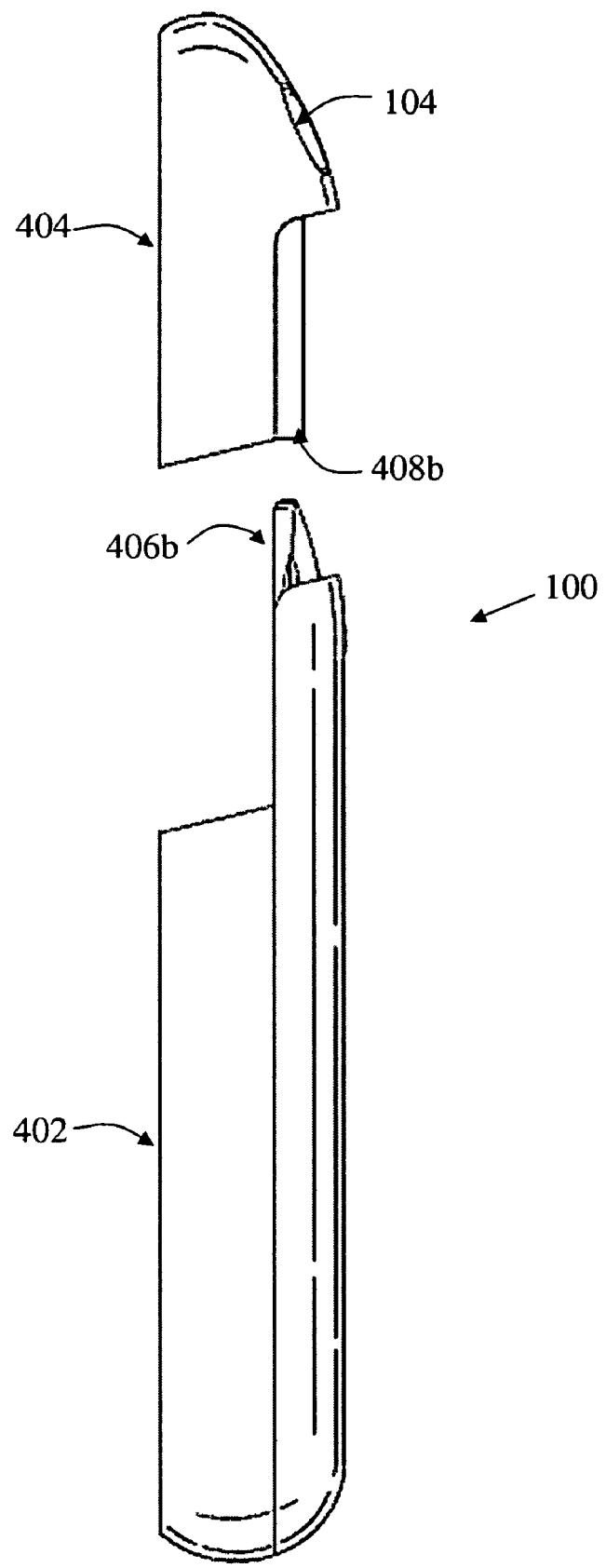
FIG. 12 illustrates the second side view of the battery pack of FIG. 1 in an open position.

FIG. 12 illustrates the second side view of the battery pack of FIG. 1 in an open position.

Figure 13:
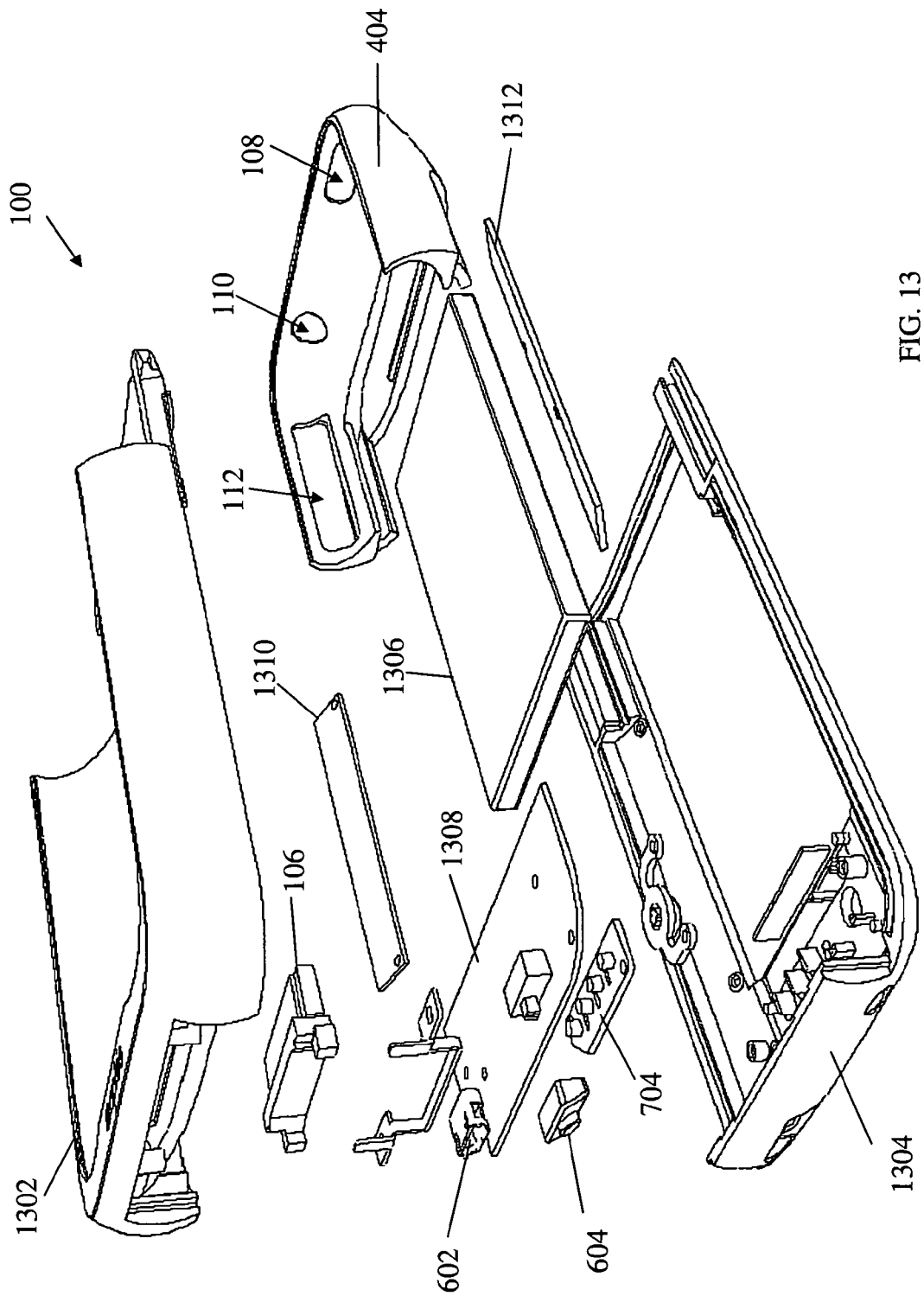
FIG. 13 is an exploded view of components of the battery pack of FIG. 1.

FIG. 13 is an exploded view of components of the battery pack of FIG. 1. In this example, the battery pack may include a first bottom section 1302 and a second bottom section 1304 which form a top and bottom shell in between which one or more circuit boards 1308, 1310, and/or 1312 and/or one or more power cells 1306 are housed. That is, the circuits boards 1308, 1310, 1312 and/or power cell(s) 1306 are sandwiched between the top and bottom sections 1302 and 1304 of the battery pack 100. Consequently, the rechargeable power cell(s) 1306 may be housed within the thickness of the back plane of the battery pack.

In some instance, the circuit boards and or power cell of the battery pack may cause interference with the antenna or signaling of the mobile device which is in close proximity. Consequently, one aspect provides for reducing the size of a primary circuit board 1308 by adding secondary circuit boards 1310 and 1312 which are electrically coupled to the primary circuit board 1308. This allows reducing the size of the circuit board 1308 thereby reducing interference to the antenna of the mobile device. Additionally, the ground for the power cell 1306 may be coupled to the ground for the mobile device (via the internal interface 106) to reduce interference to the mobile device.

Figure 14:
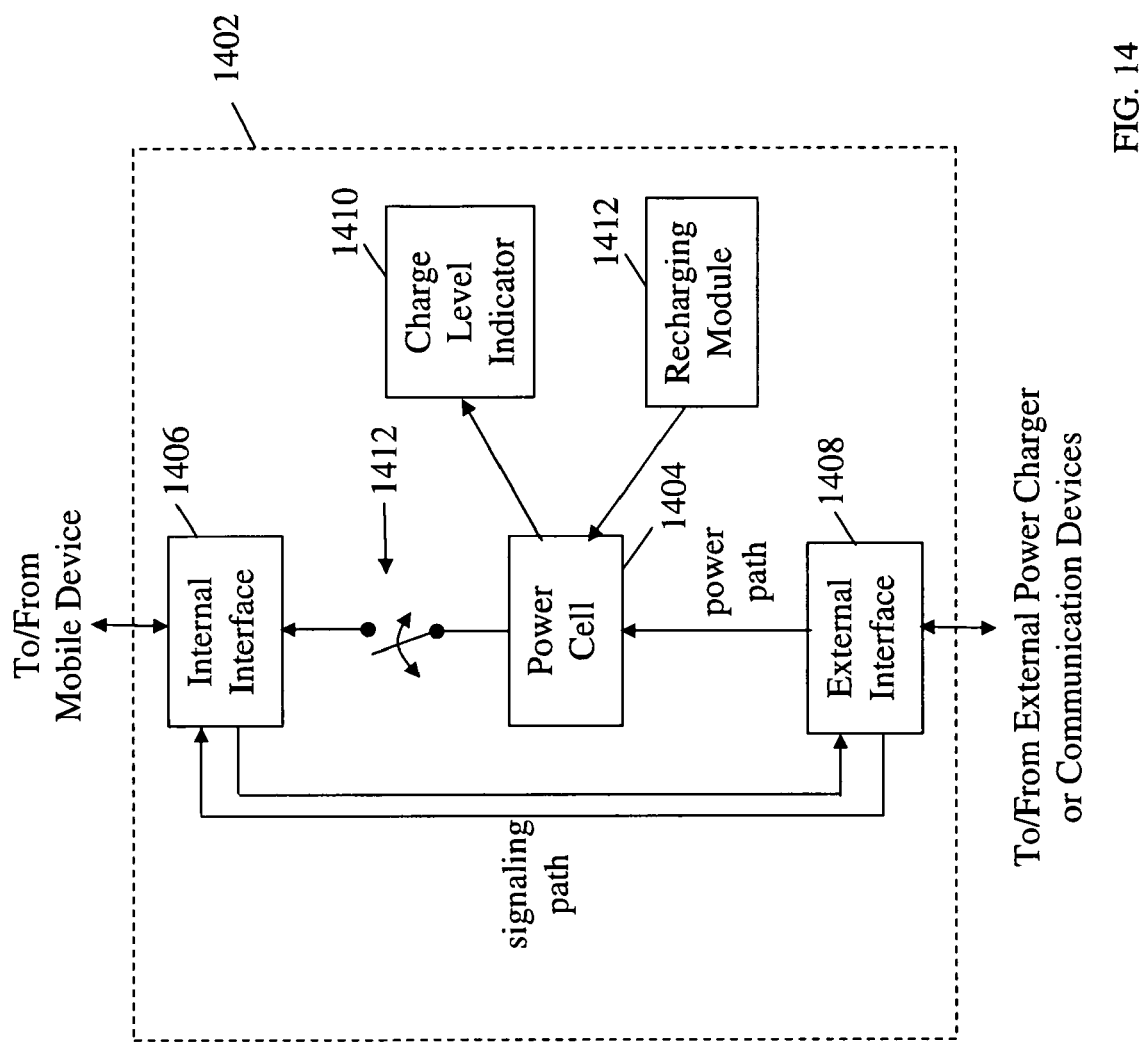
FIG. 14 illustrates a block diagram for the battery pack of FIG. 1.

FIG. 14 illustrates a block diagram for the battery pack 100 of FIG. 1. The battery pack 1402 may include a power cell 1404, an internal interface 1406, an external interface 1408, and charge level indicator 1410. The internal interface 1406 may be adapted to provide a mobile device power from the power cell 1404 as well as passing signal to/from the mobile device to the external interface 1408. The external interface 1408 may allow recharging of the power cell 1404 as well as passing signals to/from the mobile device via the internal interface 1406. A switch 1412 may allow switching power from the power cell 1404 to the mobile device On and Off as desired. Also, a charge level indicator 1410 permits displaying of the charge level of the power cell 1404. Additionally, a recharging module 1412 serves to recharge to power cell 1404 when needed.

Second Embodiment of Battery Pack

FIGS. 15-16 and 18-22 illustrate yet another embodiment of the power pack. In this embodiment, the power pack may operate as previously disclosed but does not include a top section. By removing the top section, the battery pack is more compact in size and ergonomic so that it does not significantly increase or change the size, thickness, and/or shape of mobile communication device 1602 secured thereto.

Figure 15:
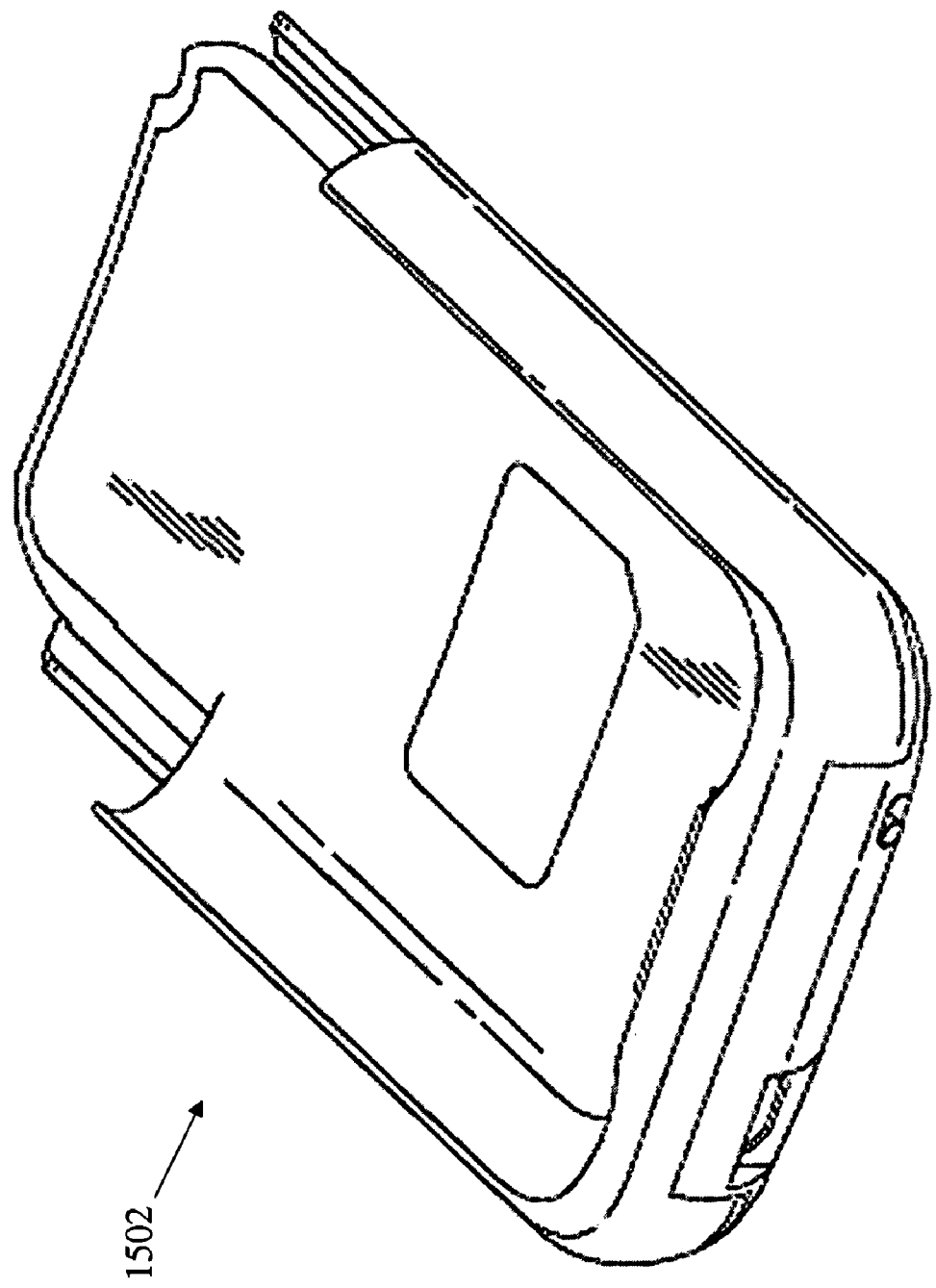
FIG. 15 illustrates a perspective view of the battery pack.

FIG. 15 illustrates a perspective view of the battery pack 1502.

Figure 16:
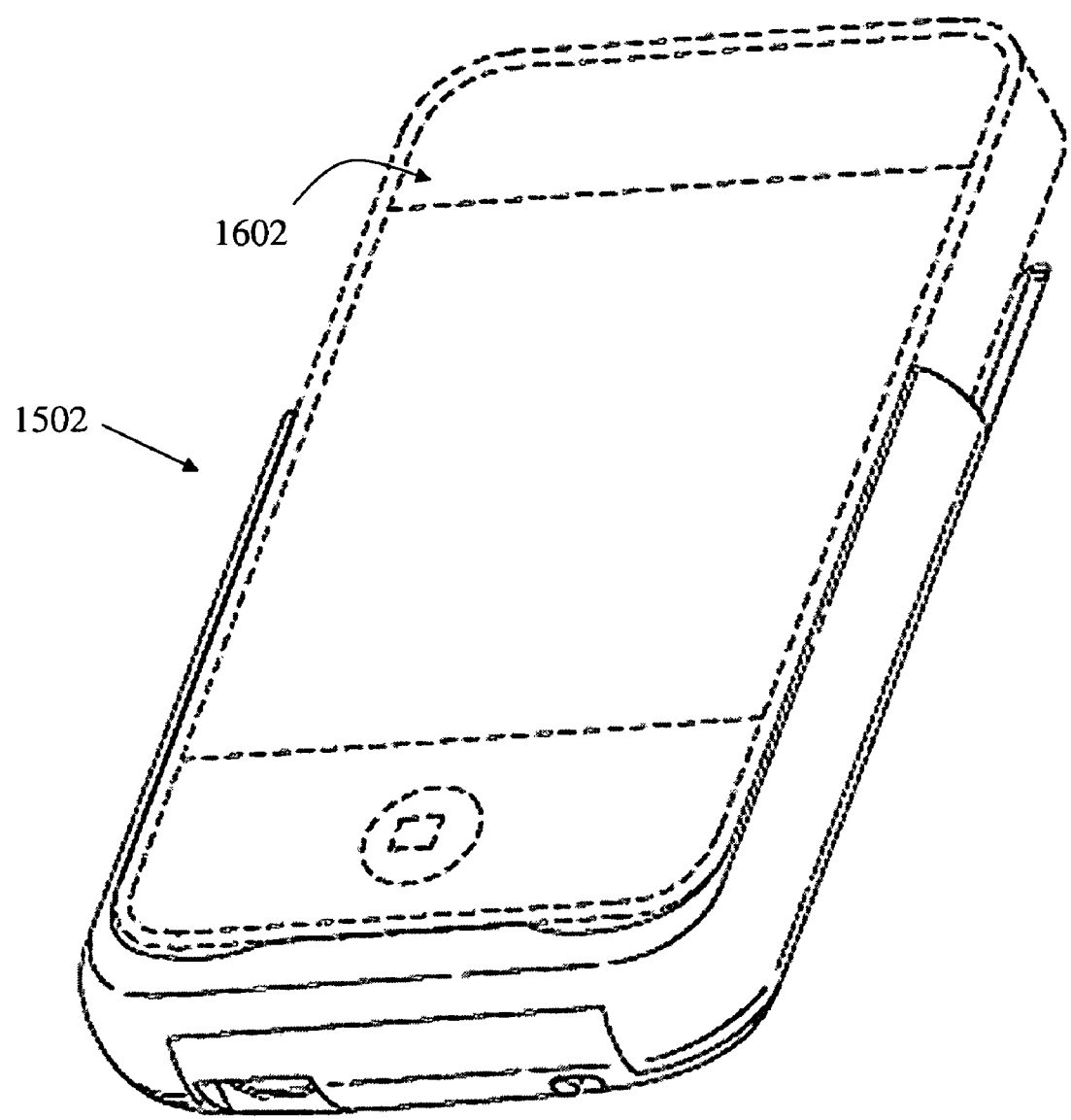
FIG. 16 illustrates a perspective view of the battery pack with a mobile device 1602 inserted therein.

FIG. 16 illustrates a perspective view of the battery pack 1502 with a mobile device 1602 inserted therein.

Figure 18:
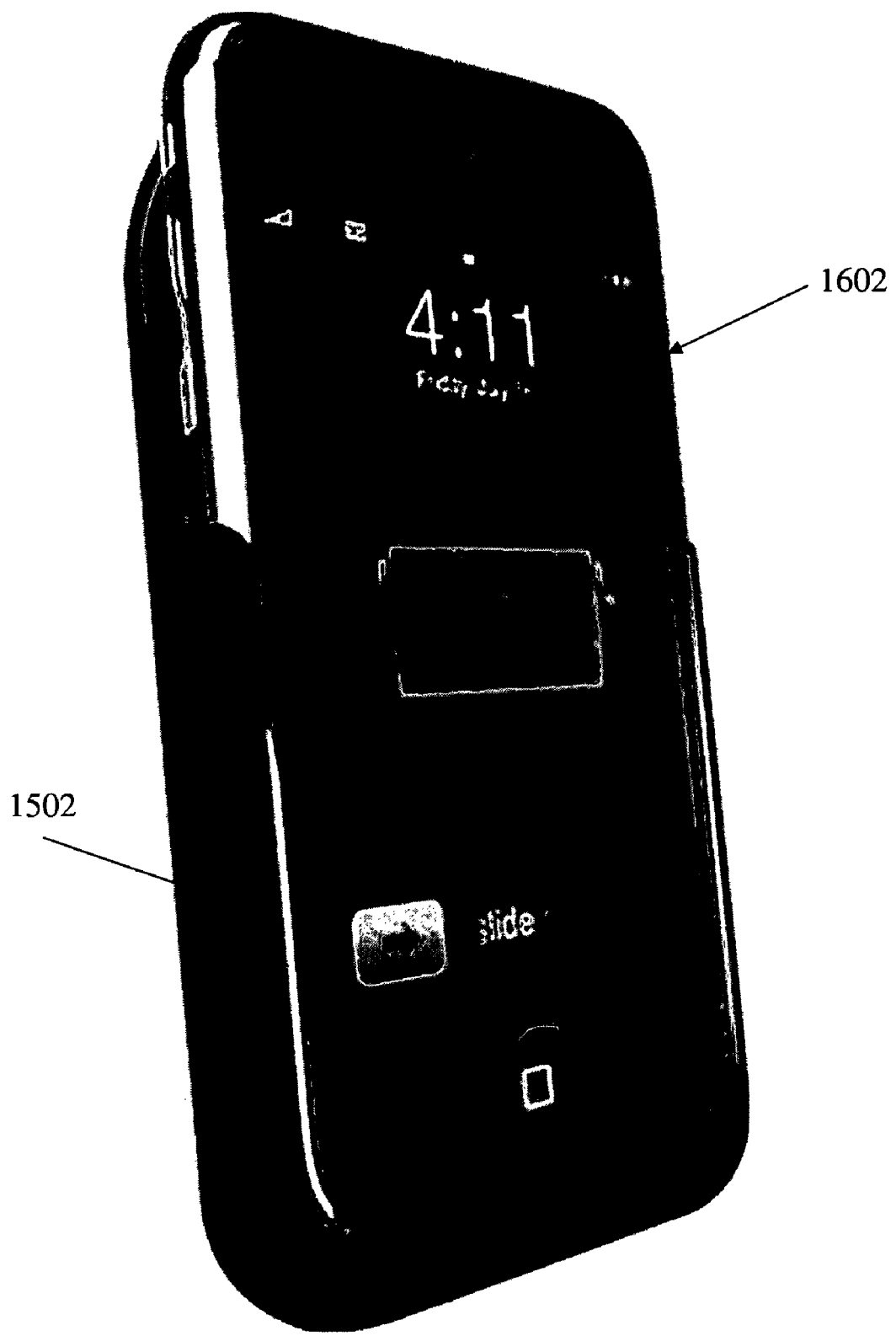
FIG. 18 illustrates another perspective view of the battery pack.

FIG. 18 illustrates another perspective view of the battery pack 1502.

Figure 19:
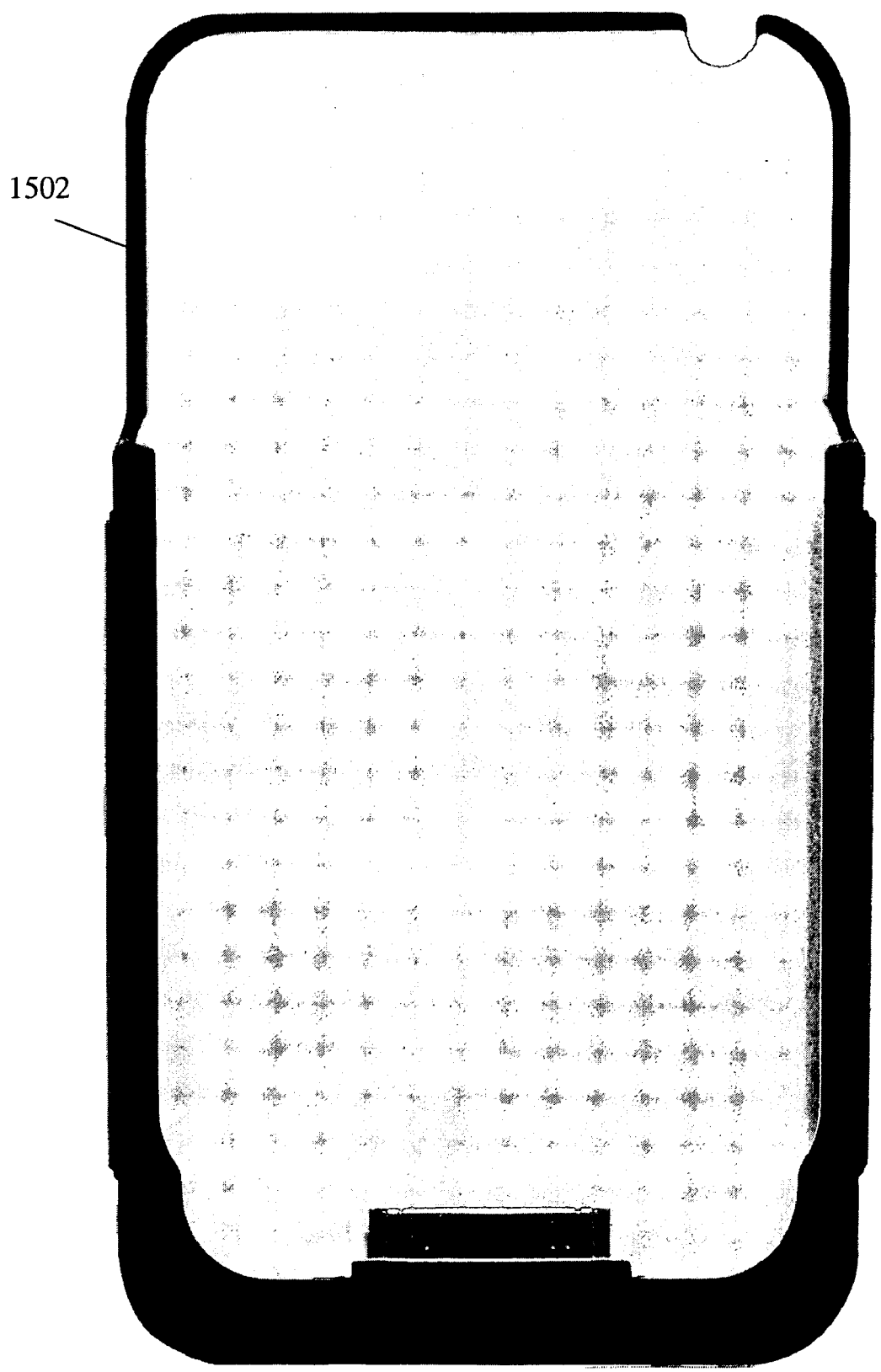
FIG. 19 illustrates a front view of the battery pack.

FIG. 19 illustrates a front view of the battery pack 1502.

Figure 20:
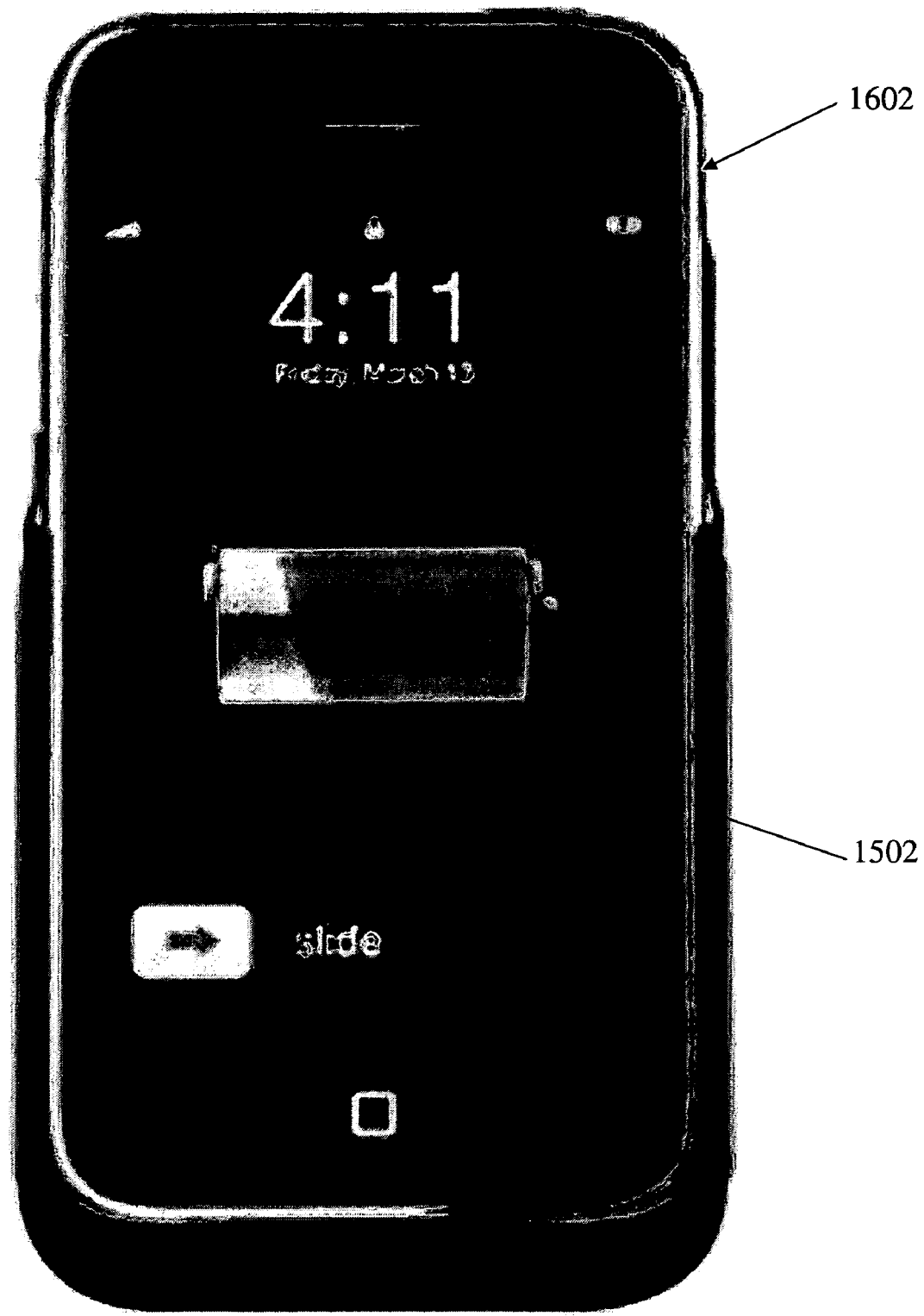
FIG. 20 illustrates a front view of the battery pack 1502 with the mobile device inserted therein.

FIG. 20 illustrates a front view of the battery pack 1502 with the mobile device inserted therein.

Figure 21:
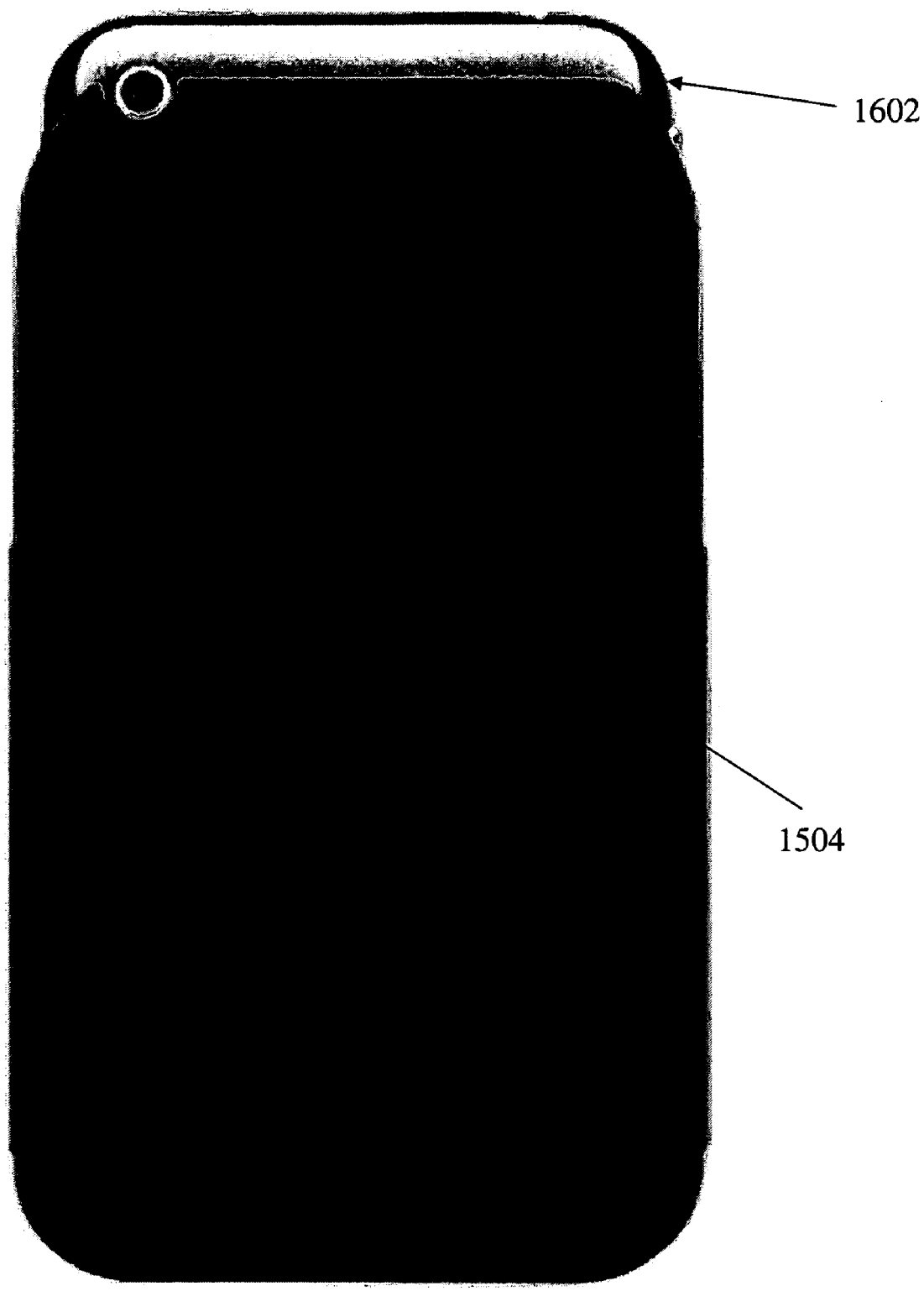
FIG. 21 illustrates a back view of the battery pack with the mobile device inserted therein.

FIG. 21 illustrates a back view of the battery pack 1502 with the mobile device 1602 inserted therein.

Figure 22:
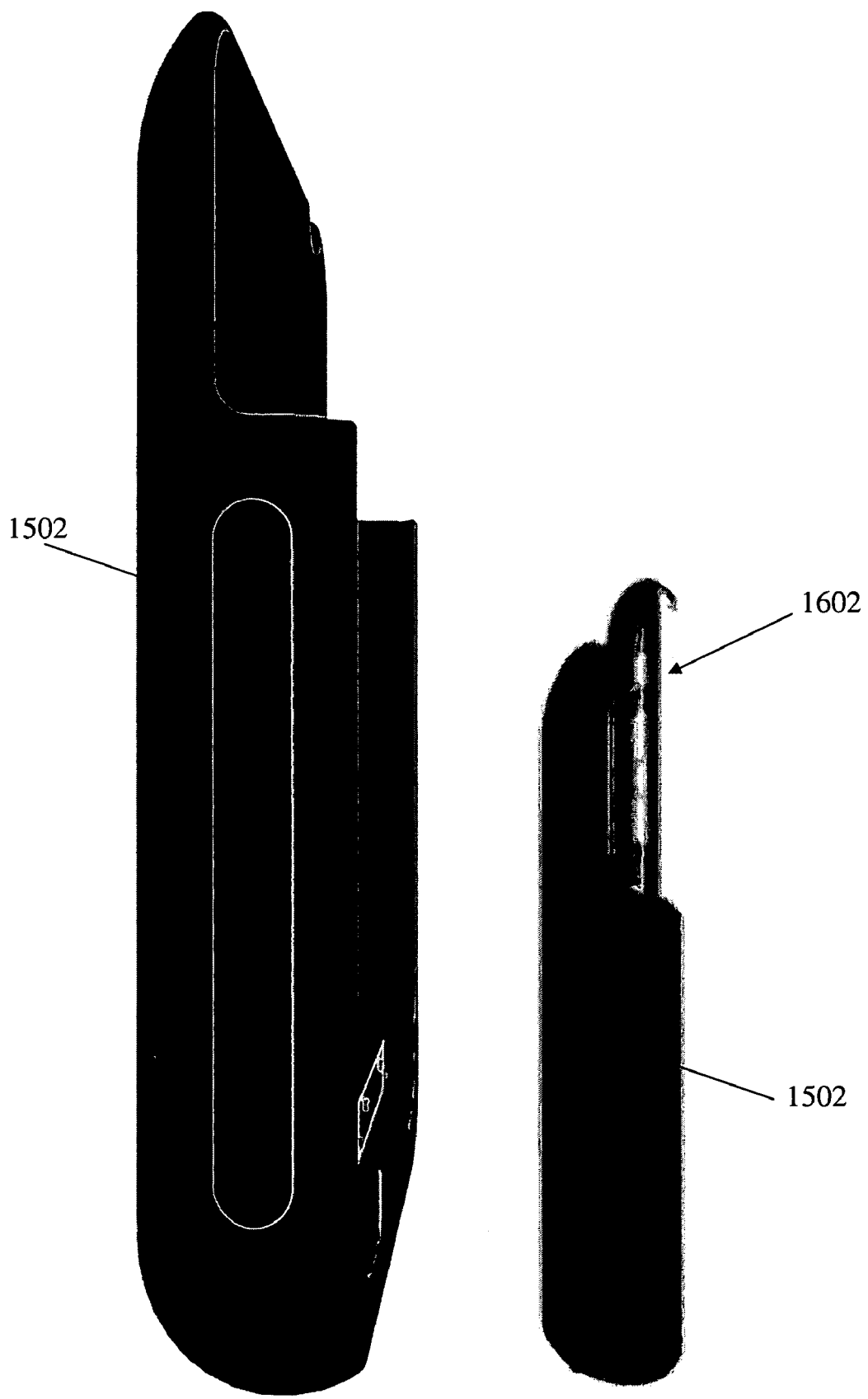
FIG. 22 illustrates a side view of the battery pack with and without the mobile device.

FIG. 22 illustrates a side view of the battery pack 1502 with and without the mobile device 1602. Note that, in some embodiments, the left and right sides may be symmetrical.

Extendible Processing and Interfacing Platform

Figure 17:
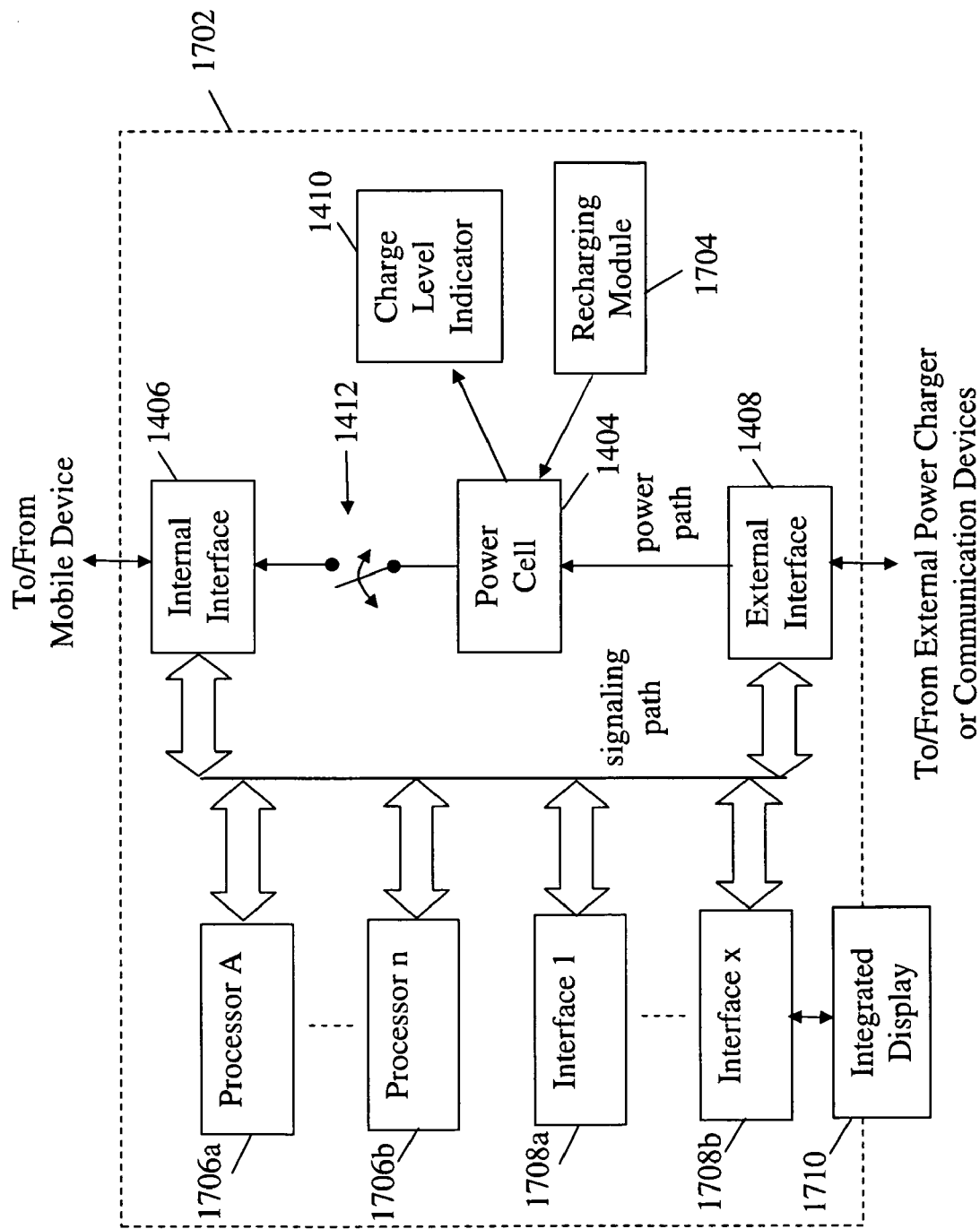
FIG. 17 illustrates a battery pack that also operates as an extendible processing and/or interfacing platform for a mobile device.

FIG. 17 illustrates a battery pack that also operates as an extendible processing and/or interfacing platform for a mobile device. In one example, the battery pack 1702 may operate as described with reference to FIG. 14. In addition, the battery pack may also include one or more processors 1706 and/or one or more interfaces 1708. The one or more processors 1706a and 1706b may allow a mobile device coupled to the internal interface 1406 to extend its processing capabilities. For instance, the mobile device may cause one or more applications to be executed on the one or more processors 1706 while using a user display on the mobile device as an output interface. Additionally, the processors 1706a and/or 1706b may be purpose-specific processors that allow the mobile device to perform particular tasks not otherwise possible on its own. For example, the processors 1706 may provide analog-to-digital conversion, audio signal sampling, temperature measuring, etc., which may not be available to the standard mobile device.

The one or more interfaces 1708a and 1708b may also provide the mobile device a means by which to communicate or acquire signals. These interfaces 1708a and 1708b may effectively expand the communication interfaces available to the mobile device by providing wired and/or wireless communication interfaces for various types of signals (e.g., audio, infrared, etc.).

The battery pack 1702 may also include a recharging module 1704 that facilitates recharging of the power cell 1404. For example, the recharging module 1704 may be a wireless or cordless charging device that inductively or otherwise facilitates recharging of the power cell 1404.

In one example implementation, the battery pack 1702 may be adapted to function as a Medical Processing Unit which may have build-in capabilities for monitoring real-time health conditions (e.g., alcohol levels in breath, pulse, temperature, blood pressure, test and/or diagnose diabetes, etc.) via build-in test port. Consequently, the battery pack 1702 can collect and/or process such collected data and store it in the mobile device. Note that the processing of such data may be directed by an application that operates either on the one or more processors of the battery pack 1702 and/or the processor(s) of the mobile device. According to one feature, if an abnormal health condition occurs (e.g., a heart attack, fainting, seizure, etc.), the Medical Processing Unit may detect this condition and automatically activate the mobile device (e.g., cellular phone) to send urgent text message or emails to a doctor, hospital, or emergency responder. The responding party (doctor, hospital, emergency responder) may be able to locate the patient via a global positioning system or information from the mobile device.

In another example implementation, the battery pack 1702 may be adapted to function as a Gaming Processing Unit that may include the capability of turning the mobile device into a real handheld gaming device with joysticks or large PSP/DS type of gaming buttons and communication devices. Consequently, the mobile device may be configured to operate as an input and/or output interface (e.g., via a display on the mobile device or battery pack) for a game.

In yet another example, the battery pack 1702 may be adapted to function as a Home Entertainment Unit that may include the capability of turning the mobile device into a Universal Smart Remote Control which can control all the IR activated units in a home or office (e.g., control garage doors, television sets, security alarm, air conditioning, lighting, etc.). For this purpose, the battery pack 1702 may include various interfaces 1708 that provide the specific infrared and/or wireless protocols and/or signaling to control such devices.

Speakers & Microphone

Another feature may provide for one or more speakers to be included as part of the battery packs or holster (illustrated in FIGS. 1-22). For instance a low-profile speaker may be housed within the back plane of a battery pack so that the sound may be emitted from the rear or sides of the battery pack. When a mobile device is inserted and coupled to the battery pack, it couples to an interface that electrically connects the speaker to the mobile device. The mobile device may send audio or sound signals to the speaker via an interface with the battery pack. This allows a user to listen to audio stored in the mobile device without the need for headphones.

Similarly, another feature may provide for one or more microphones to be included as part of the battery packs (illustrated in FIGS. 1-22). One or more microphones may be housed within the battery pack (e.g., back plane) so that they may capture sound from a user. The microphone may be electrically coupled to an interface that allows sending captured audio signals to a mobile device that may be coupled to the battery pack.

According to yet another feature, when the mobile device is coupled to the battery pack 1702, it may cause one or more applications to execute on the processors 1706. These applications may continue to operate or execute even if the mobile device is removed or decoupled from the battery pack 1702. For example, the battery pack may continue to collect data (e.g., monitor medical conditions for a patient to which it is coupled) and wirelessly transmits the collected data or an alarm to the mobile device. This is possible since the processors 1706 may be powered by the power cell 1404 and can be configured to operate whether or not the mobile device is coupled to the battery pack.

Integrated Display

In some embodiments of the battery pack 1702, battery pack 1702 may also include an integrated display or screen. For example, the integrated display may be on the outer surface of the back plane of the battery pack. Alternatively, the display 1710 may slide out from within the housing of the battery pack. This integrated display 1720 may allow displaying additional information or data to a user. The additional display screen may be electrically coupled to the mobile device (via an interface) to allow the mobile device to send images or video to the additional display screen.

In another example, the rear of the back plane may house a Braille input and/or output interface that electrically coupled a mobile device mounted within the holster or battery pack.

In yet another embodiment, the rear of the back plane may provide a keypad that serves as an input to the mobile device.

According to anther feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

Consequently, a battery pack for a mobile communication device is provided comprising: (a) a casing or holster (e.g., FIG. 4, 402 and/or 404) defining a cavity (FIG. 1, 102) that conforms, at least partially, to the outer shape of the mobile communication device (FIG. 2, 202); and/or (b) one or more rechargeable power cells (FIG. 13, 1306) housed within the thickness (between 1302 and 1304) of the casing. The casing secures the mobile communication device (202) within the cavity (102) while at least one surface (e.g., a display screen) of the mobile communication device remains exposed. An internal interface (106) engages a corresponding interface on the mobile communication device to provide power from the one or more rechargeable cells (1306) to the mobile communication device. An external interface (FIG. 6, 602) electrically couples to the internal interface (106) to transmit signals from the mobile communication device to an external device. The external interface (602) may further serve to recharge the one or more rechargeable power cells. The casing further defines one or more access openings (104, 108, 110, 112) to permit access to integrated interfaces of the mobile communication device (202).

The battery pack (100 or 1502) may further include a recharging device (1704) integrated within the battery pack that wirelessly recharges the one or more rechargeable power cells (1306).

An extendible communication and/or processing platform may be provided to mobile communication device by the battery back. For instance, a plurality of communication interfaces (1708) may be coupled to the internal interface (106 or 1406), wherein the mobile communication device (202) can transmit and receive signals via the communication interfaces (1708). Similarly, at least one processor (1706) may be coupled to the internal interface (106 or 1406), and adapted to collect information via one or more interfaces (1708) of the battery pack and provide the collected information to the mobile communication device (202). At least one processor (1706) may be adapted to execute one or more instructions under the control of the mobile communication device (202). According to one feature, a display interface (1710) may be integrated into the battery pack to display information to a user.

The thickness of the battery pack (100 or 1502) is less than twice the thickness of the mobile communication device. In some embodiments, the thickness of the battery pack may extend, for example, between ten and ninety percent more than the thickness of the mobile communication device. For example, the battery pack may extend a mere thirty to fifty percent more than the thickness of the mobile communication device.

Similarly, a battery pack (100) for a mobile device (202) may include (a) a back plane (304), (b) a first and second sides (306 and 308), (c) a bottom side (312), wherein the back plane (304) and first (306), second (308) and bottom (312) sides define a cavity (102) for mounting the mobile device (202); and (d) one or more battery cells (1306) housed within the thickness of the back plane (304). One or more speakers may be housed within the thickness of the back plane (304) and electrically coupled to an interface (106) to allow a mobile device (202) mounted in the cavity (102) to send audio signals through the one or more speakers. Similarly, one or more microphones may be housed within the thickness of the back plane (304) and electrically coupled to an interface (106) to allow a mobile device (202) mounted in the cavity (102) to receive audio signals from the one or more microphones.

One or more of the features illustrated in FIGS. 1-22 may be rearranged and/or combined into a single component or embodied in several components. Additional components may also be added without departing from the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A battery pack for a mobile device comprising:
   a bottom portion comprising:
      a back plane upon which a back of a housing of the mobile device will be placed against, wherein the back plane comprises a top edge;
      a battery cell, enclosed in the bottom portion;
      a processor, coupled to the battery cell;
      a bottom sidewall, connected to the back plane at an end opposite of the top edge, that will be positioned against a bottom side edge of the mobile device;
      an internal interface, on the bottom sidewall, positioned to connect to an interface on the mobile device, and coupled through the processor to the battery cell; and
      an external interface, positioned on an outside bottom side of the bottom portion, coupled through the processor to the battery cell and internal interface; and
   a top portion comprising:
      a top side that will be positioned against a top side edge of the mobile device when the top portion is seated against the bottom portion; and
      an open side end, opposite of the top side,
   wherein the top portion slides onto the bottom portion through the open side end,
   wherein when the top portion is seated against the bottom portion, the top and bottom portions meet at and form a seam which extends across a back of the battery pack, and when the top portion is seated against the bottom portion, a first open-polygon-shaped opening for the bottom portion merges with a second open-polygon-shaped opening for the top portion to form a cavity of the battery pack through which a screen of the mobile device will be visible, the cavity having a closed shape.

2. The battery pack of claim 1 wherein the battery cell is rechargeable.

3. The battery pack of claim 2 wherein the mobile device can transmit and receive signals via the external interface.

4. The battery pack of claim 3 wherein the processor is adapted to collect information via the internal or the external interface and configured to provide the collected information to the mobile device.

5. The battery pack of claim 4 wherein the processor is adapted to execute an instruction received from the mobile device.

6. The battery pack of claim 5 the bottom portion further comprising:
   a display interface, coupled to the processor, the display interface configured to display information to a user of the mobile device.

7. The battery pack of claim 6 wherein the display interface comprises a plurality of LEDs.

8. The battery pack of claim 6, further comprising a button.

9. The battery pack of claim 8, wherein the display interface displays a charge level of the battery cell when the button is depressed.

10. The battery pack of claim 1, wherein the external interface is a micro_USB plug.

11. The battery pack of claim 1, further comprising an on/off power switch.

12. The battery pack of claim 1, further comprising a first opening that will be positioned over a camera lens of the mobile device.

13. The battery pack of claim 12, further comprising a second opening that will be positioned over the power button of the mobile device.

14. The battery pack of claim 13, further comprising a third opening that will be positioned over the audio jack of the mobile device.

15. The battery pack of claim 14, further comprising a fourth opening that will be positioned over the volume control of the mobile device.

16. The battery pack of claim 1 wherein a device ground from the mobile device is coupled to a case ground for the power cell.

17. The battery pack of claim 1, wherein the bottom portion further comprises a plurality of receiving grooves and the top portion further comprises a plurality of rails, wherein the plurality of rails fit within the plurality of receiving grooves when the top portion is seated against the bottom portion.

18. The battery pack of claim 1 further comprising a loudspeaker.

19. The battery pack of claim 1 further comprising a microphone.

20. The battery pack of claim 1 further comprising a wireless communication interface.

21. The battery pack of claim 20 wherein the wireless communication interface comprises an infrared interface.

22. The battery pack of claim 21 wherein the battery function is capable of functioning as a universal smart remote control.

23. The battery pack of claim 20 wherein the wireless communication interface comprises an audio interface.

24. The battery pack of claim 20 wherein the wireless communication interface comprises a radio communication interface.

25. The battery pack of claim 24 wherein the radio communication interface comprises a Bluetooth wireless interface.

26. The battery pack of claim 1 capable of communicating via an interface that is not built into the mobile device.

27. The battery pack of claim 1 capable of measuring an external temperature.

28. The battery pack of claim 1 wherein the processor is capable of executing an analog-to-digital signal conversion.

29. The battery pack of claim 1 further comprising a joystick.

30. The battery pack of claim 1 further comprising at least one gaming button.

31. The battery pack of claim 1 adapted to function as a medical processing unit.

32. The battery pack of claim 31 adapted to monitor a real-time health condition via a test port.

33. The battery pack of claim 32 wherein the test port is capable of detecting alcohol levels in breath.

34. The battery pack of claim 32 wherein the test port is capable of monitoring a body temperature.

35. The battery pack of claim 32 wherein the test port is capable of monitoring a blood pressure.

36. The battery pack of claim 32 wherein the test port is capable of detecting diabetes.

37. The battery pack of claim 32 wherein the test port is capable of detecting an abnormal health condition.

38. The battery pack of claim 37 wherein upon detecting an abnormal health condition the battery pack activates the mobile device to send a message via a text message or an email to medical personnel.

39. The battery pack of claim 38 wherein the message comprises the current location of the mobile device.

40. The battery pack of claim 38 wherein the message comprises a description of the abnormal health condition detected.

41. The battery pack of claim 1 further comprising an inductive electrical recharging system.

42. The battery pack of claim 41 wherein the inductive electrical recharging system requires no direct contact.

43. The battery pack of claim 1 wherein the mobile device is capable of executing an application in the battery pack.

44. The battery pack of claim 43 wherein the application continues running once the mobile device is removed.

45. A battery pack for a mobile device comprising:
a first portion comprising:
    a back plane against which a back of a housing of the mobile device will be positioned, wherein the back plane comprises a top edge;
    a battery cell, enclosed in the first portion;
    a bottom sidewall, connected to the back plane at an end opposite of the top edge, that will be positioned against a bottom side edge of the mobile device;
    an internal interface, on the bottom sidewall, positioned to connect to an interface on the mobile device, and coupled to the battery cell; and
    an external interface, positioned on an outside of the first portion, coupled to the battery cell and internal interface; and
a second portion comprising:
    a top side that will be positioned against a top side edge of the mobile device when the second portion is seated against the first portion; and
    an open side end, opposite of the top side, wherein the second portion slides onto the bottom portion through the open side end, wherein when the second portion is seated against the bottom portion a first open-polygon-shaped opening for the first portion merges with a second open-polygon-shaped opening for the second portion to form a cavity of the battery pack through which a screen of the mobile device will be visible, the cavity having a closed shape.

46. The battery pack of claim 45 further comprising:
a button; and
a display interface configured to display battery charge level to a user of the mobile device when the user depresses the button.

47. The battery pack of claim 46 further comprising an on/off power switch.

48. The battery pack of claim 47 further comprising a first opening positioned over a camera lens of the mobile device.

49. The battery pack of claim 48 further comprising a second opening positioned over the power button of the mobile device.

50. The battery pack of claim 49 further comprising a third opening positioned over the audio jack of the mobile device.

51. The battery pack of claim 50 further comprising a fourth opening positioned over the volume control of the mobile device.

52. The battery pack of claim 51 wherein the external interface is a micro_USB port.

53. A battery pack for a mobile device comprising:
a first portion comprising:
    a back plane against which a back of a housing of the mobile device will be positioned, wherein the back plane comprises a top edge;
    a first sidewall connected to the back plane that will be positioned against a first side edge of the mobile device; and
    wherein the first portion comprises a first open-polygon-shaped opening;
a second portion comprising:
    a second sidewall that will be perpendicular to the back plane and positioned against a second side edge of the mobile device when the second portion is seated against the first portion;
    wherein the second portion comprises a second open-polygon-shaped opening; and
    an open side end, wherein the second portion slides onto the first portion through the open side end, wherein the first open-polygon-shaped opening of the first portion and the second open-polygon-shaped opening of the second portion merge to form a cavity through which a screen of the mobile device will be visible, the cavity having a closed shape;
wherein the first portion can be secured to the second portion to secure the mobile device in place;
a battery cell;
a first external interface; and
an internal interface positioned to connect to a device interface on the mobile device and coupled to the wireless communication module.

54. The battery pack of claim 53 further comprising:
a button; and
a display interface configured to display battery charge level to a user of the mobile device when the user depresses the button.

* * * * *

UNITED STATES PATENT AND TRADEMARK OFFICE
Certificate

Patent No. 8,367,235 B2                                                             Patented: February 5, 2013

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Daniel Huang, Santa Ana, CA (US); and Matthew Brand, Brooklyn, NY (US).

Signed and Sealed this Twelfth Day of August 2014.

<div style="text-align: right;">
PATRICK RYAN<br>
<i>Supervisory Patent Examiner</i><br>
Art Unit 1726<br>
Technology Center 1700
</div>

EX PARTE REEXAMINATION CERTIFICATE (10686th)
United States Patent
Huang et al.

(10) Number: US 8,367,235 C1
(45) Certificate Issued: *Aug. 17, 2015

(54) BATTERY PACK, HOLSTER, AND EXTENDIBLE PROCESSING AND INTERFACE PLATFORM FOR MOBILE DEVICES

(75) Inventors: Daniel Huang, Santa Ana, CA (US); Matthew Brand, Brooklyn, NY (US)

(73) Assignee: MOPHIE, INC., Santa Ana, CA (US)

Reexamination Request:
No. 90/013,319, Sep. 18, 2014

Reexamination Certificate for:
Patent No.: 8,367,235
Issued: Feb. 5, 2013
Appl. No.: 12/357,262
Filed: Jan. 21, 2009

Certificate of Correction issued Aug. 12, 2014

(*) Notice: This patent is subject to a terminal disclaimer.

Related U.S. Application Data

(63) Continuation of application No. 12/357,262, filed on Jan. 21, 2009, which is a continuation-in-part of application No. 12/356,068, filed on Jan. 19, 2009, now abandoned.

(60) Provisional application No. 61/021,897, filed on Jan. 18, 2008.

(51) Int. Cl.
| | | |
|---|---|---|
| *H01M 2/10* | (2006.01) | |
| *H01M 6/04* | (2006.01) | |
| *H01M 10/46* | (2006.01) | |
| *G01R 31/36* | (2006.01) | |
| *G06F 1/16* | (2006.01) | |
| *H04M 1/02* | (2006.01) | |
| *H01M 10/48* | (2006.01) | |
| *H02J 7/00* | (2006.01) | |

(52) U.S. Cl.
CPC ......... *H01M 2/1022* (2013.01); *G01R 31/3606* (2013.01); *G06F 1/1626* (2013.01); *G06F 1/1632* (2013.01); *H01M 10/46* (2013.01); *H01M 10/488* (2013.01); *H02J 7/0042* (2013.01); *H02J 7/0047* (2013.01); *H04M 1/0254* (2013.01); *H04M 1/0262* (2013.01); *H04M 1/0283* (2013.01); *H01M 2220/30* (2013.01); *Y10T 29/49108* (2015.01)

(58) Field of Classification Search
None
See application file for complete search history.

(56) References Cited

To view the complete listing of prior art documents cited during the proceeding for Reexamination Control Number 90/013,319, please refer to the USPTO's public Patent Application Information Retrieval (PAIR) system under the Display References tab.

*Primary Examiner* — Joseph Kaufman

(57) ABSTRACT

A battery pack is provided for a mobile communication device, comprising a casing defining a cavity that conforms, at least partially, to the outer shape of the mobile communication device and one or more rechargeable power cells housed within the thickness of the casing. An internal interface engages a corresponding interface on the mobile communication device to provide power from the one or more rechargeable cells to the mobile communication device. An external interface is electrically coupled to the internal interface in order to transmit signals from the mobile communication device to an external device and may further serve to recharge the one or more rechargeable power cells. The battery pack may also serve as an extendible platform by providing additional integrated communication interfaces and/or processors that can be utilized by the mobile communication device to extend its communication and/or processing capabilities.

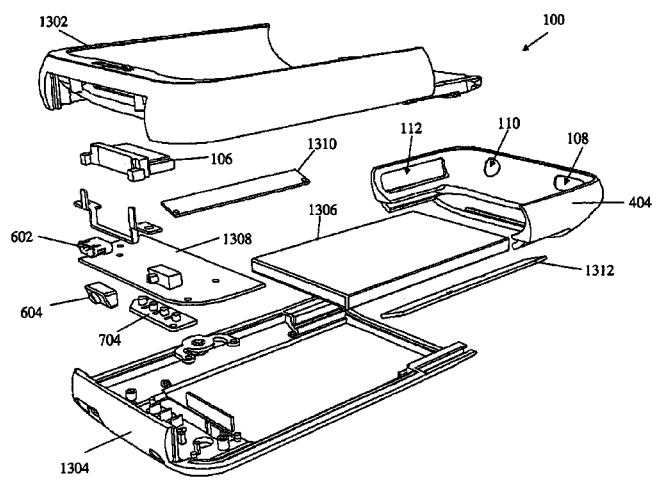

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-52 is confirmed.

Claim 53 is determined to be patentable as amended.

Claim 54, dependent on an amended claim, is determined to be patentable.

New claims 55-69 are added and determined to be patentable.

53. A battery pack for a mobile device comprising:
a first portion comprising:
 a back plane against which a back of a housing of the mobile device will be positioned, wherein the back plane comprises a top edge;
 a [first] *bottom* sidewall, connected to the back plane *at an end opposite of the top edge,* that will be positioned against a [first] *bottom* side edge of the mobile device; and
 wherein the first portion comprises a first open-polygon-shaped opening;
a second portion comprising:
 a second sidewall that will be perpendicular to the back plane and positioned against a second side edge of the mobile device when the second portion is seated against the first portion;
 wherein the second portion comprises a second open-polygon-shaped opening; and
 an open side end, wherein the second portion slides onto the first portion through the open side end, wherein the first open-polygon-shaped opening of the first portion and the second open-polygon-shaped opening of the second portion merge to form a cavity through which a screen of the mobile device will be visible, the cavity having a closed shape;
wherein the first portion can be secured to the second portion to secure the mobile device in place;
a battery cell;
a first external interface; and
an internal interface, *on the bottom sidewall,* positioned to connect to a device interface on the mobile device and coupled to the wireless communication module.

*55. The battery pack of claim 1, wherein the battery cell is housed within a thickness of the back plane.*

*56. The battery pack of claim 1, wherein the battery cell is positioned to be behind the back of the housing of the mobile device when the mobile device is in the battery pack.*

*57. The battery pack of claim 1, wherein the battery pack is shaped to conform to the external shape of the mobile device without significantly affecting the size and usability of the mobile device.*

*58. The battery pack of claim 1, wherein the internal interface is configured to permit transfer of data to or from the mobile device, and wherein the external interface is configured to enable the mobile device to communicate with an external device.*

*59. The battery pack of claim 1, wherein the cavity formed by the first open-polygon-shaped opening merging with the second open-polygon-shaped opening through which the screen of the mobile device will be visible has an area that spans more than half of an area of a front of the battery pack.*

*60. The battery pack of claim 45, wherein the battery cell is housed within a thickness of the back plane.*

*61. The battery pack of claim 45, wherein the battery cell is positioned to be behind the back of the housing of the mobile device when the mobile device is in the battery pack.*

*62. The battery pack of claim 45, wherein the battery pack is shaped to conform to the external shape of the mobile device without significantly affecting the size and usability of the mobile device.*

*63. The battery pack of claim 45, wherein the internal interface is configured to permit transfer of data to or from the mobile device, and wherein the external interface is configured to enable the mobile device to communicate with an external device.*

*64. The battery pack of claim 45, wherein the cavity formed by the first open-polygon-shaped opening merging with the second open-polygon-shaped opening through which the screen of the mobile device will be visible has an area that spans more than half of an area of a front of the battery pack.*

*65. The battery pack of claim 53, wherein the battery cell is housed within a thickness of the back plane.*

*66. The battery pack of claim 53, wherein the battery cell is positioned to be behind the back of the housing of the mobile device when the mobile device is in the battery pack.*

*67. The battery pack of claim 53, wherein the battery pack is shaped to conform to the external shape of the mobile device without significantly affecting the size and usability of the mobile device.*

*68. The battery pack of claim 53, wherein the internal interface is configured to permit transfer of data to or from the mobile device, and wherein the first external interface is configured to enable the mobile device to communicate with an external device.*

*69. The battery pack of claim 53, wherein the cavity formed by the first open-polygon-shaped opening merging with the second open-polygon-shaped opening through which the screen of the mobile device will be visible has an area that spans more than half of an area of a front of the battery pack.*

\* \* \* \* \*